(12) United States Patent
Lung et al.

(10) Patent No.: US 7,968,876 B2
(45) Date of Patent: Jun. 28, 2011

(54) PHASE CHANGE MEMORY CELL HAVING VERTICAL CHANNEL ACCESS TRANSISTOR

(75) Inventors: Hsiang-Lan Lung, Dobbs Ferry, NY (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 210 days.

(21) Appl. No.: 12/471,301

(22) Filed: May 22, 2009

(65) Prior Publication Data
US 2010/0295123 A1    Nov. 25, 2010

(51) Int. Cl.
*H01L 21/00*    (2006.01)

(52) U.S. Cl. .......... 257/42; 257/328; 438/102; 438/268; 438/275

(58) Field of Classification Search ................ 257/42, 257/328; 438/102, 268, 275
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshiksky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |

(Continued)

FOREIGN PATENT DOCUMENTS
WO    WO-2004025659 A1    3/2004

OTHER PUBLICATIONS

"Magnetic Bit Boost," www.sciencenews.org, Dec. 18 & 25, 2004, p. 389, vol. 166.

(Continued)

*Primary Examiner* — Richard A. Booth
(74) *Attorney, Agent, or Firm* — Haynes Beffel & Wolfeld LLP

(57) ABSTRACT

Memory devices are described along with methods for manufacturing. A device as described herein includes a substrate having a first region and a second region. The first region comprises a first field effect transistor comprising first and second doped regions separated by a horizontal channel region within the substrate, a gate overlying the horizontal channel region, and a first dielectric covering the gate of the first field effect transistor. The second region of the substrate includes a second field effect transistor comprising a first terminal extending through the first dielectric to contact the substrate, a second terminal overlying the first terminal and having a top surface, and a vertical channel region separating the first and second terminals. The second field effect transistor also includes a gate on the first dielectric and adjacent the vertical channel region, the gate having a top surface that is co-planar with the top surface of the second terminal. A second dielectric separates the gate of the second field effect transistor from the vertical channel region.

15 Claims, 23 Drawing Sheets

U.S. PATENT DOCUMENTS

| | | |
|---|---|---|
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 7,023,008 B1 | 4/2006 | Happ |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,052,941 B2 | 5/2006 | Lee |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,116,593 B2 * | 10/2006 | Hanzawa et al. ............. 365/203 |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |

| | | |
|---|---|---|
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,215,564 B2 | 5/2007 | Happ et al. |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 * | 4/2008 | Abbott .................... 257/302 |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 2002/0017701 A1 | 2/2002 | Klersy et al. |
| 2002/0028541 A1 | 3/2002 | Lee et al. |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1 | 2/2005 | Harshfield |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0270832 A1 | 12/2005 | Chu et al. |
| 2005/0280061 A1 | 12/2005 | Lee |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0154467 A1 | 7/2006 | Hoffman et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0275962 A1 | 12/2006 | Lee |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0086235 A1 | 4/2007 | Kim et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |

| | | | |
|---|---|---|---|
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166600 A1 | 7/2009 | Park et al. |
| 2009/0166603 A1 | 7/2009 | Lung |
| 2009/0268507 A1 | 10/2009 | Breitwisch et al. |
| 2009/0289242 A1 | 11/2009 | Breitwisch et al. |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Hanzawa, Satoru, et al., "A 512kB Embedded Phase Change Memory with 416kB/s Write Throughput at 100µA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Goebel, B., et al., "Fully Depleted Surrounding Gate Transistor (SGT) for 70 nm DRAM and Beyond," IEEE IEDM 2002, 10.8.1-10.8.4.

Jeong, Min-Kyu, et al., "Gate Work Function and Contact Engineering in Nanoscale Vertical Pillar Transistor for DRAM Cell Transistors," Kyoto, Japan, Nov. 5-8, 2007, pp. 112-113.

Maeda, S, et al. "A Vertical Φ-Shape Transistor (VΦT) Cell for 1Gbit DRAM and Beyond," 1994 Symposium on VLSI Technology, Digest of Technical Papers. Jun. 7-9, 1994 pp. 133-134.

Oh, J.H., et al., "Full Integration of Highly Manufacturable 512Mb PRAM based on 90nm Technology," IEEE IEDM Technical Digest, pp. 49-52, 2006.

Risch, Lothar, et al., "Recent Progress with Vertical Transistors," Solid-State Device Research Conference, 1997. Proceeding of the 27th European Sep. 22-24, 1997 pp. 34-41.

* cited by examiner

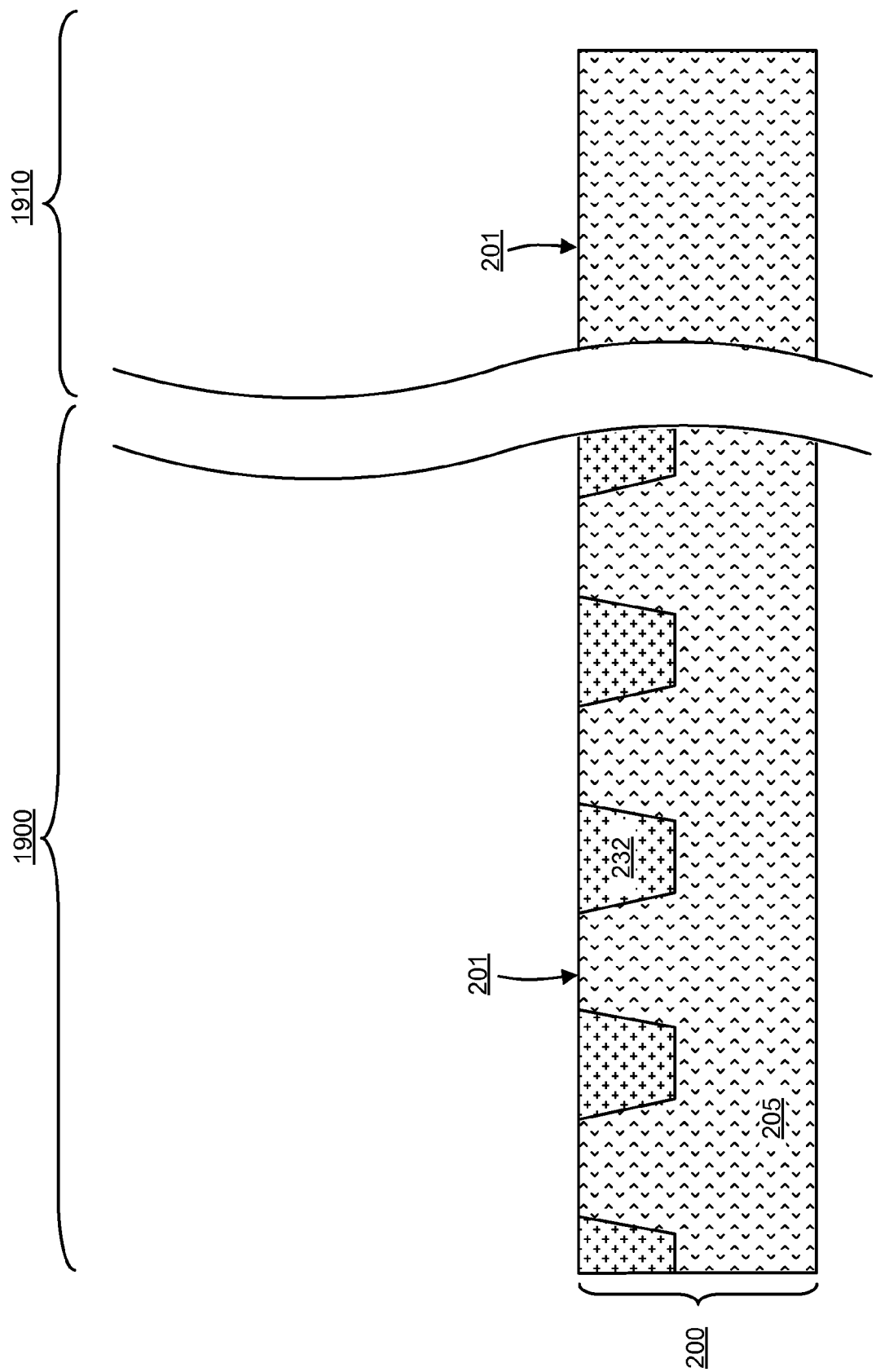

PHASE CHANGE MEMORY CELL HAVING VERTICAL CHANNEL ACCESS TRANSISTOR

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change memory materials, including chalcogenide based materials and on other programmable resistance materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistance material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the molten phase change material and allowing at least a portion of the phase change material to stabilize in the amorphous state.

The magnitude of the current needed for reset can be reduced by reducing the size of the phase change material element in the cell and/or the contact area between electrodes and the phase change material, so that higher current densities are achieved with small absolute current values through the phase change material.

One approach to reducing the size of the phase change element in a memory cell is to form small phase change elements by etching a layer of phase change material. However, reducing the size of the phase change element by etching can result in damage to the phase change material due to non-uniform reactivity with the etchants which can cause the formation of voids, compositional and bonding variations, and the formation of nonvolatile by-products. This damage can result in variations in shape and uniformity of the phase change elements across an array of memory cells, resulting in electrical and mechanical performance issues for the cell.

Additionally, it is desirable to reduce the cross-sectional area or footprint of individual memory cells in an array of memory cells in order to achieve higher density memory devices. However, traditional field effect transistor access devices are horizontal structures having a horizontally oriented gate overlying a horizontally oriented channel region, resulting in the field effect transistors having a relatively large cross-sectional area which limits the density of the array. Attempts at reducing the cross-sectional area of horizontally oriented field effect transistors can result in issues in obtaining the current needed to induce phase change because of the relatively low current drive of field effect transistors.

Thus, memory devices including both vertically and horizontally oriented field effect transistors have been proposed. See, for example, U.S. Pat. No. 7,116,593. However, the integration of both vertically and horizontally oriented field effect transistors can be difficult and increase the complexity of designs and manufacturing processes. Thus, issues that devices having both vertically and horizontally oriented field effect transistors need to address include cost and simplicity of manufacturing.

Although bipolar junction transistors and diodes can provide a larger current drive than field effect transistors, it can be difficult to control the current in the memory cell using a bipolar junction transistor or a diode adequately enough to allow for multi-bit operation. Additionally, the integration of bipolar junction transistors with CMOS periphery circuitry is difficult and may result in highly complex designs and manufacturing processes.

It is therefore desirable to provide both vertically and horizontally oriented field effect transistors on the same substrate that are readily manufactured for use in high-density memory devices, as well as in other devices that may have a need for both types of transistors on one chip. It is also desirable to provide memory devices providing the current necessary to induce phase change, as well as addressing the etching damage problems described above.

SUMMARY OF THE INVENTION

Devices having both vertically and horizontally oriented field effect transistors are described along with methods for manufacturing. A device as described herein includes a substrate having a first region and a second region. The first region includes a first field effect transistor comprising first and second doped regions separated by a horizontal channel region within the substrate. A gate of the first field effect transistor overlies the horizontal channel region, and a first dielectric covers the gate. The second region of the substrate includes a second field effect transistor comprising a first terminal extending through the first dielectric to contact the substrate, a second terminal overlying the first terminal and having a top surface, and a vertical channel region separating the first and second terminals. A gate of the second field effect transistor is on the first dielectric and adjacent the vertical channel region, the gate having a top surface that is co-planar with the top surface of the second terminal. A second dielectric separates the gate of the second field effect transistor from the vertical channel region.

In embodiments the device is a memory device in which the first region is a periphery region and the second region is a memory region, and the second region further comprises a programmable resistance memory element electrically coupled to the second terminal of the field effect transistor.

In embodiments the second region further comprises a plurality of word lines on the first dielectric, and an array comprising a plurality of field effect transistors including the second field effect transistor, the gate of the second field effect transistor coupled to a corresponding word line in the plurality of word lines.

In embodiments described herein the second terminals of the transistors and the word lines are both planarized using a planarization process, such as CMP, so that the top surfaces of the second terminals and the word lines are co-planar. Additionally, a silicide process can then be performed to form both conductive caps comprising silicide on the top surfaces of the second terminals, and conductive layers comprising silicide on the top surfaces of the word lines at the same time.

In embodiments the vertical field effect transistors can be formed within the corresponding word line such that the allocated cross-sectional area of memory cells in an array can be determined entirely by dimensions of the word lines and bit lines, allowing for a high memory density of the array.

The channel region and the first and second terminals are arranged vertically so that the field effect transistor can have a small cross-sectional area while also providing sufficient current to induce phase change. The length of the channel of the device is determined by the height of the channel region and can made small, while the width of the channel of the device is dependent upon the circumference of the channel region and can be made relatively large compared to the length. Thus, a relatively large width-to-length ratio can be achieved such that higher reset current can be obtained.

A method for manufacturing a device as described herein comprises forming a substrate and forming a first dielectric on the substrate. A plurality of openings are formed in the first dielectric to expose portions of the substrate. First and second terminals and channel regions of respective field effect transistors are formed within corresponding openings in the plurality of openings, the first terminals contacting the substrate. A portion of the first dielectric is removed to expose outer surfaces of the channel regions, and a second dielectric is formed on the exposed outer surfaces of the channel regions. Wordline material is formed on remaining portions of the first dielectric and surrounding the second dielectric, and the word line material is patterned to form a plurality of word lines. Programmable resistance memory material is formed electrically coupled to the second terminals of the field effect transistors, and conductive material is formed on the programmable resistance memory material.

Also, in embodiments described herein logic devices in the periphery region and memory cells having vertical channel transistors are manufactured concurrently. The first terminals of the transistors of the memory cells and the gate dielectric of logic devices in the periphery region can both be formed on the top surface of the same substrate. Additionally, the word lines are formed on the material from the dielectric layer that covers the gate structure of the logic device in the periphery region. As a result, memory devices described herein include vertical channel transistors compatible with CMOS periphery circuitry and addressing the complexity of design integration and manufacturing processes.

Other aspects and advantages of the present invention can be seen on review of the drawings, the detailed description, and the claims which follow.

BRIEF DESCRIPTION OF THE DRAWINGS

FIGS. 3-11B illustrate steps in a fabrication sequence for manufacturing the array of memory cells of FIGS. 2A-2B.

DETAILED DESCRIPTION

Figure 1:
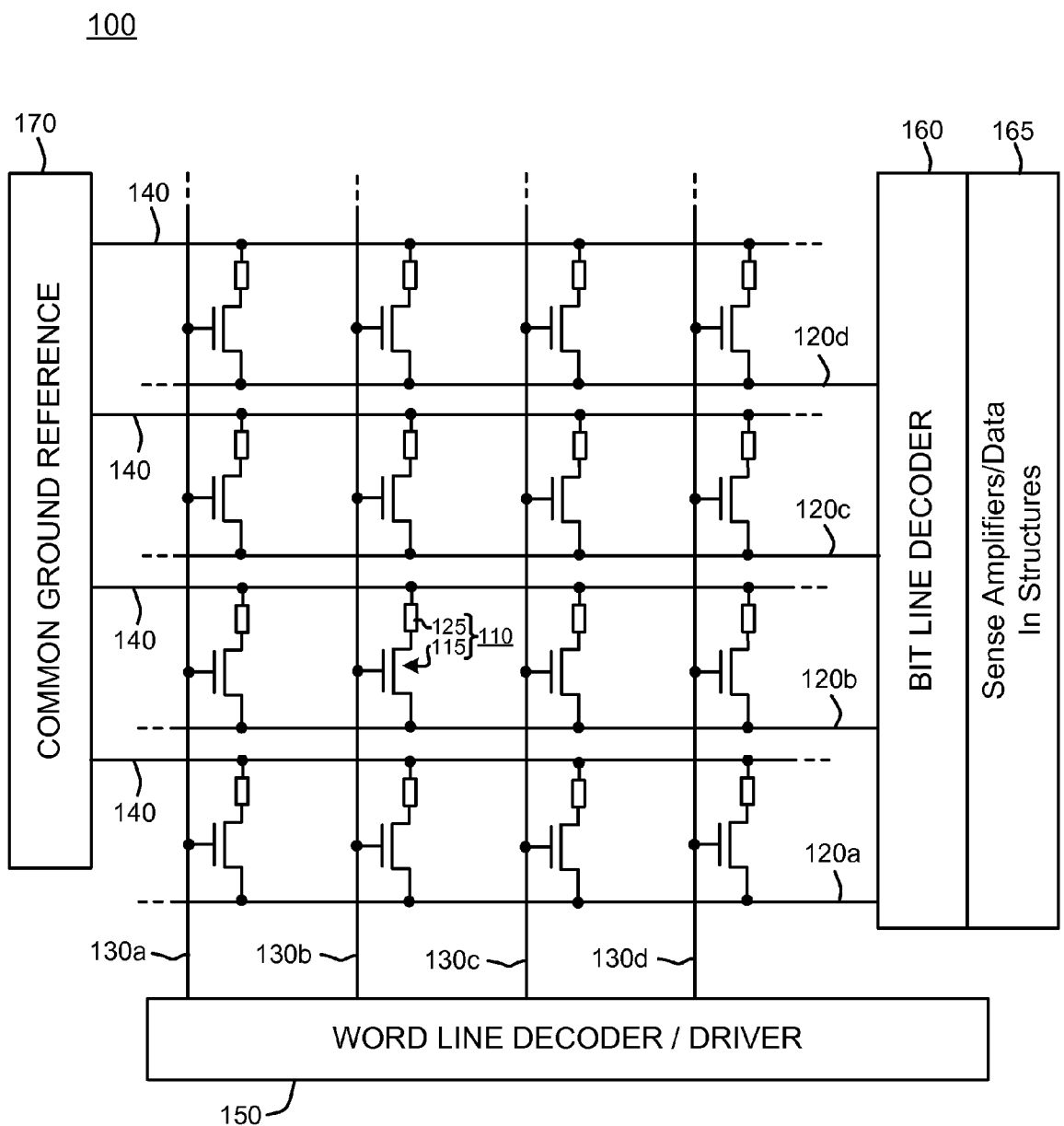
FIG. 1 illustrates a schematic diagram of a portion of a memory cell array implemented using memory cells having field effect transistors with vertical channels and memory elements comprising programmable resistance material of a memory plane.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a memory cell array 100 implemented using memory cells having field effect transistors with vertical channels and memory elements comprising programmable resistance material of a memory plane as described herein.

As shown in the schematic diagram of FIG. 1, each of the memory cells of array 100 includes a field effect transistor access device and a memory element arranged in electrical series, the memory elements capable of being set to one of a plurality of resistive states and thus capable of storing one or more bits of data.

The array 100 comprises a plurality of bit lines 120 including bit lines 120a, 120b, 120c, 120d extending in parallel in a first direction and in electrical communication with bit line decoder 160. The field effect transistors of the array 100 have first terminals acting as a source or drain coupled to a corresponding bit line 120.

A plurality of word lines 130 including word lines 130a, 130b, 130c, 130d extend in parallel in a second direction and are in electrical communication with word line decoder/driver 150. As described in more detail below with respect to FIGS. 2A-2B, the word lines 130 overly the bit lines 120. The word lines 130 are adjacent to the vertical channels of the field effect transistors to act as the gate terminals of the transistors. In alternative embodiments, the word lines 130 may completely or partially surround the channels, or otherwise lie adjacent the channels, and are separated from the channels by a gate dielectric layer.

The memory elements of the memory cells of array 100 comprise respective portions of the programmable resistance memory material of a memory plane (described in more detail below with respect to FIGS. 2A-2B) overlying the bit lines 130 and word lines 120 of the array 100. The memory elements of the memory cells are electrically coupled to the second terminals of the field effect transistors by electrodes 250 that provide a small contact area between the field effect transistors and the memory elements.

The memory plane includes conductive material 140 (described in more detail below with respect to FIGS. 2A-2B) on the programmable resistance memory material. The conductive material 140 of the memory plane is electrically coupled to a memory plane termination circuit 170. In the illustrated embodiment the memory plane termination circuit 170 is a ground terminal, but may alternatively include a voltage source for applying a common voltage other than ground to the conductive material of the memory plane.

Memory cell 110 is representative of memory cells of array 100 and comprises field effect transistor 115 and phase change memory element 125 arranged electrically in series between the memory plane and the corresponding bit lines 120. The word line 130b acts as the gate terminal of the transistor 115, and the first terminal (acting as the source or drain of the transistor 115) is coupled to bit line 120b. The memory element 125, comprising programmable resistance memory material of the memory plane overlying the word lines 130 and bit lines 120, is electrically coupled between the second terminal of the transistor 125 and the conductive material 140 of the memory plane.

Reading or writing to memory cell 110 of array 100 can be achieved by applying an appropriate voltage to the corresponding word line 130b and an appropriate voltage or current the corresponding bit line 120b to induce a current through the memory element 125. The level and duration of the voltages/currents applied is dependent upon the operation performed, e.g. a reading operation or a writing operation.

In a reset (erase) operation of the memory cell 110, a reset pulse applied to the word line 130b and the bit line 120b induces a current through the memory element 125 to cause a transition of an active region of the memory element 125 into an amorphous phase, thereby setting the phase change material to a resistance within a resistive value range associated with the reset state. The reset pulse is a relatively high energy pulse, sufficient to raise the temperature of at least the active region of the memory element 125 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of memory cell 110, a program pulse is applied to the word line 130b and the bit line 120b of suitable amplitude and duration to induce a current through the memory element 125 sufficient to raise the temperature of at least a portion of the active region of the memory element 125 above the transition temperature and cause a transition of at least a portion of the active region from the amorphous phase into a crystalline phase, this transition lowering the resistance of the memory element 125 and setting the memory cell 110 to the desired state.

In a read (or sense) operation of the data value stored in the memory cell 110, a read pulse applied to the corresponding word line 130b and the corresponding bit line 120b of suitable amplitude and duration to induce current to flow through the memory element 125 that does not result in the memory element 125 undergoing a change in resistive state. The current through the memory cell 110 is dependent upon the resistance of the memory element 125 and thus the data value stored in the memory cell 110. The data valued stored in the memory cell 110 may be determined, for example, by comparison of the current on bit line 120b with a suitable reference current by sense amplifiers of block 165. Alternatively, the data value stored in the memory cell 110 may be determined, for example, using source side sensing by comparison of the current on the conductive material 140 of the memory plane with a suitable reference current.

Figure 2A:
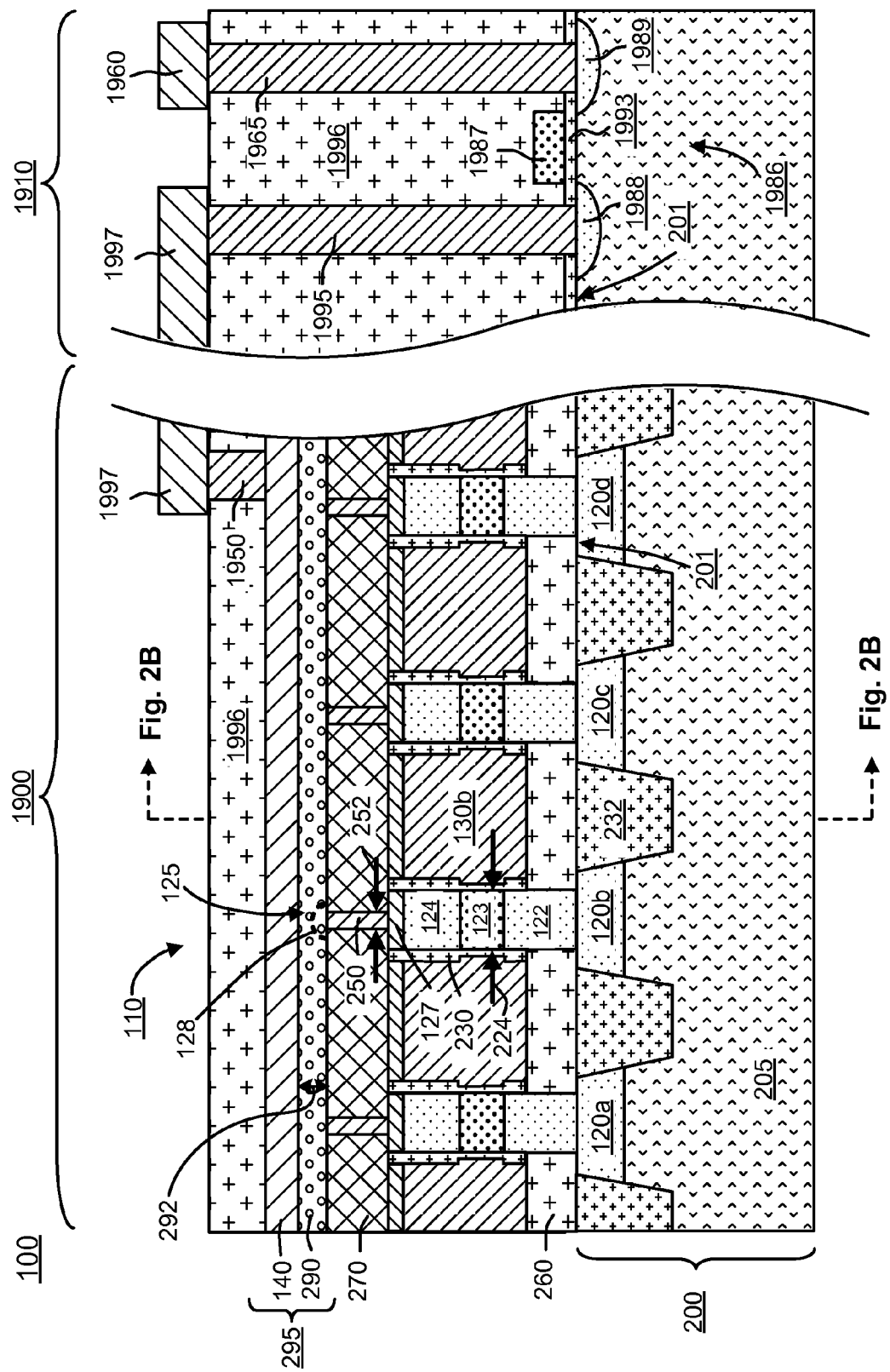
FIGS. 2A-2B illustrate cross-sectional views of a portion of an embodiment of memory cells arranged in the array of FIG. 1.
Figure 2B:
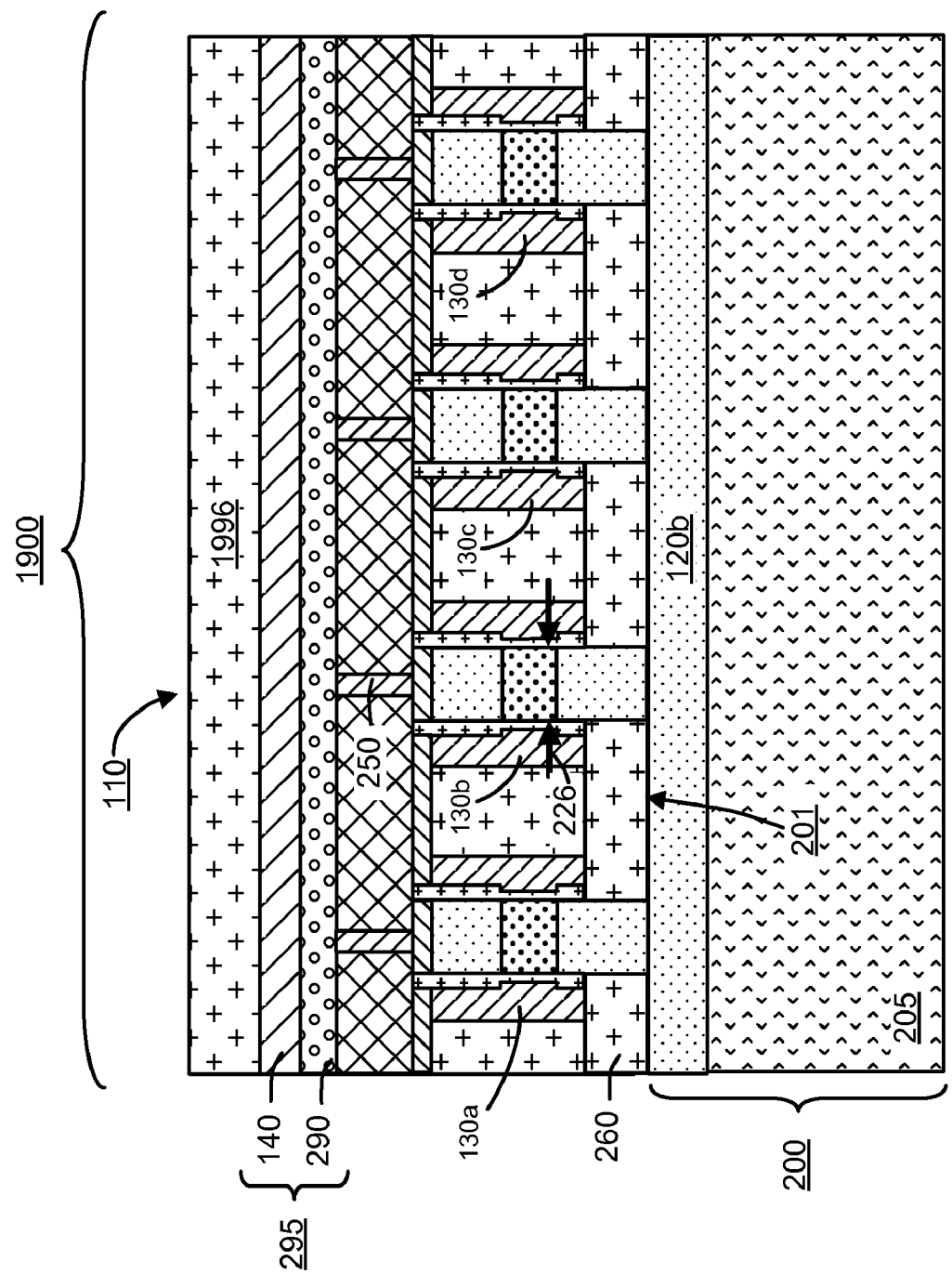

FIGS. 2A and 2B illustrate cross-sectional views of a portion of an embodiment of memory cells (including representative memory cell 110) arranged in the array 100, FIG. 2A taken along the word lines 130 and FIG. 2B taken along the bit lines 120.

The array 100 includes a memory region 1900 and periphery region 1910 on the single-crystalline semiconductor substrate 200. The substrate 200 has a substantially planar top surface 201. As used herein, the term "substantially planar" is intended to accommodate manufacturing tolerances during the formation of the substrate 200. The term "substantially planar" is also intended to accommodate manufacturing processes performed following the formation of the substrate 200 which may cause variations in the planarity of the top surface 201.

The periphery region 1910 includes logic device 1986 having a gate structure 1987 on a gate dielectric layer 1993. The gate dielectric layer 1993 is on the top surface 201 of the substrate 200. The gate structure 1987 comprises a layer of doped polysilicon on the gate dielectric layer 1993, and a layer of silicide on the doped polysilicon.

The logic device 1986 includes doped regions 1988, 1989 within the substrate 200 acting as the source and drain regions. A dielectric 1996 comprising one or more layers of dielectric material is on the logic device 1986.

Contact 1965 is coupled to doped region 1989 and extends to the top surface of dielectric 1996 to line 1960. Contact 1995 is coupled to the doped region 1988 and extends to the top surface of dielectric 1996 to line 1997. The line 1997 extends into memory region 1900 and is coupled to the conductive material 140 of the memory plane 295 by contact 1950 extending through dielectric 1996.

The array 100 includes a single-crystalline substrate 200 comprising a well 205 having a first conductivity type and bit lines 120 within the well 205. The bit lines 120 extend in a first direction into out of the cross-section illustrated in FIG. 2A and are separated by dielectric trench isolation structures 232 within the well 205. The bit lines 120 comprise doped substrate material having a second conductivity type opposite that of the first conductivity type. In the illustrated embodiment the doped substrate material of the bit lines 120 comprises high doped N-type (N+) material of the substrate 200, and the well 205 comprise doped P-type material of the substrate 200.

The field effect transistor 115 of the memory cell 110 includes a first terminal 122 comprising doped semiconductor material on the corresponding bit line 120b, a channel region 123 comprising doped semiconductor material on the first terminal 122, and a second terminal 124 comprising doped semiconductor material on the channel region 123.

A conductive cap 127 comprising silicide is on the second terminal 124. The conductive cap 127 may comprise, for example, a silicide containing Ti, W, Co, Ni, or Ta. The conductive cap 127 provides a low resistance contact between the doped semiconductor material 126 and an electrode 250.

In the illustrated embodiment the first and second terminals 122, 124 comprise highly doped N-type material, and the channel region 123 comprises doped P-type material.

The first and second terminals 122, 124, the channel region 123, and the conductive cap 127 form a stack which is surrounded by a dielectric 230, the dielectric 230 separating the channel region 123 from the corresponding word line 130b.

The word lines 130, include word line 130b acting as the gate of the field effect transistor 115 of the memory cell 110, extend into and out of the cross section illustrated in FIG. 2B and comprise doped polysilicon material and a silicide layer on the doped polysilicon. The stack formed by the first and second terminals 122, 124, the channel region 123, and the conductive cap 127 extends through a via in the word line 130b to electrically couple the bit line 120b to the electrode 250, the via in the word line 130b having a sidewall surface 135 surrounding the channel region 123.

The electrode 250 is on the conductive cap 127 and extends through dielectric 270 to a memory element 125 comprising a portion of the programmable resistance memory material 290 of memory plane 295. The programmable resistance memory material may comprise, for example, one or more elements from the group of Ge, Sb, Te, Se, In, Ti, Ga, Bi, Sn, Cu, Pd, Pb, Ag, S, Si, O, P, As, N and Au.

The electrode 250 may comprise, for example, TiN or TaN. TiN may be preferred in embodiments in which memory material 290 comprises GST (discussed in more detail below) because it makes good contact with GST, it is a common material used in semiconductor manufacturing, and it provides a good diffusion barrier at the higher temperatures at which GST transitions, typically in the 600-700° C. range. Alternatively, the electrode 250 may comprise, for example, one or more elements from the group of Ti, W, Mo, Al, Ta, Cu, Pt, Ir, La, Ni, N, O, and Ru.

The conductive material 140 of the memory plane 295 is on the programmable resistance memory material 290 and is coupled to a common voltage. In embodiments the conductive material 140 may comprise one or more conductive layers each comprising, for example, one or more elements from the group of Ti, W, Mo, Al, Ta, Cu, Pt, Ir, La, Ni, N, O, and Ru. Advantages of having at least two conductive layers for the conductive material 140 include choosing the material of a first conductive layer for compatibility with the memory material 290 of the memory plane 295, while material of a second conductive layer on the first conductive layer can be chosen for other advantages such as higher electrical conductivity than the first conductive layer.

In operation, the common voltage coupled to the conductive material 140 and voltages supplied to the word line 130b and the bit line 120b can induce current to flow from the bit line 120b to the conductive material 140, or vice versa, via the first terminal 122, channel region 123, second terminal 124, conductive cap 127, electrode 250, and memory material 290.

The active region 128 is the region of the memory element 125 in which the memory material is induced to change between at least two solid phases. As can be appreciated, the active region 128 can be made extremely small in the illustrated structure, thus reducing the magnitude of current needed to induce a phase change. The thickness 292 of the memory material 290 can be established using thin film deposition techniques. In some embodiments the thickness 292 is less than 100 nm, for example being between 10 and 100 nm. Furthermore, the electrode 250 has a width 252 less than that of the conductive cap 127, and preferably less than a minimum feature size for a process, typically a lithographic process, used to form the word lines 130 of the array 100. Thus, the electrode 250 has a top surface contacting the memory material 290 of the memory plane 295, the top surface of the electrode 250 having a surface area less than the top surface of the conductive cap 127. The small top surface of the electrode 250 concentrates current density in the portion of the memory plane 290 adjacent the electrode 250, thereby reducing the magnitude of the current needed to induce a phase change in the active region 128. Additionally, the dielectric 270 may provide some thermal isolation to the active region 128, which also helps to reduce the amount of current necessary to induce a phase change.

As can be seen in FIGS. 2A and 2B, the first terminals 122 of the access transistors in the memory region 1910 and the gate dielectric layer 1993 are both on the substantially planar top surface 201 of the substrate. As described in more detail below with reference to FIGS. 3 to 11, the logic device 1986 in the periphery region and the memory cells having vertical channels can be manufactured concurrently. As a result, the memory device has a reduced complexity and addresses design integration issues of periphery and memory regions, thereby reducing the cost.

In FIGS. 2A-2B, the active region 128 has a "mushroom" shape, and thus the configuration of the electrode 250 and the memory element 125 is commonly referred to as a mushroom-type configuration. Alternatively, other types of configurations can be used.

Figure 2C:
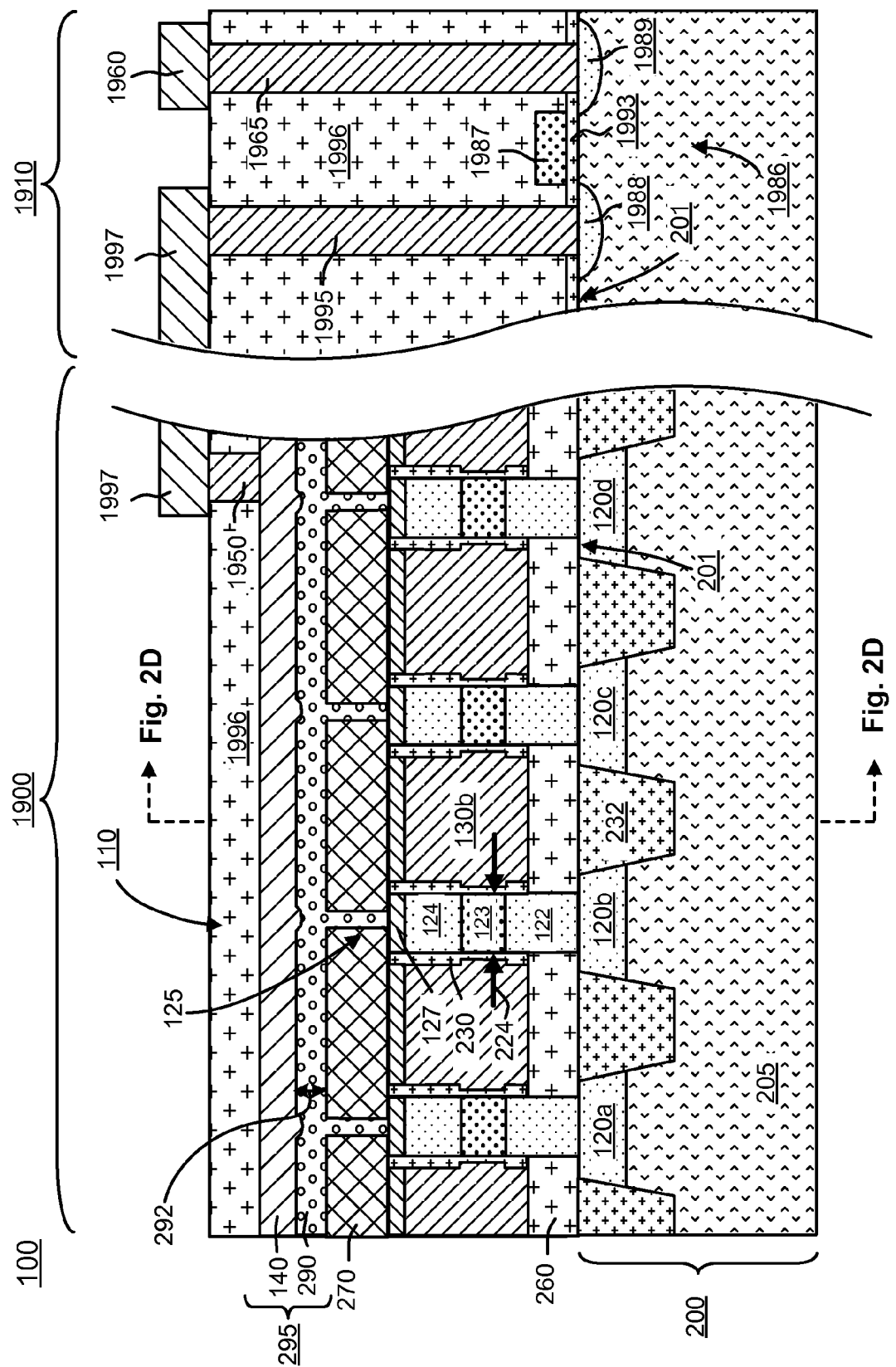
FIGS. 2C and 2D illustrate cross-sectional views an alternative embodiment in which the electrodes of the array of FIGS. 2A and 2B are omitted and the memory material of the memory element extends within the opening in the dielectric to contact the conductive cap.
Figure 2D:
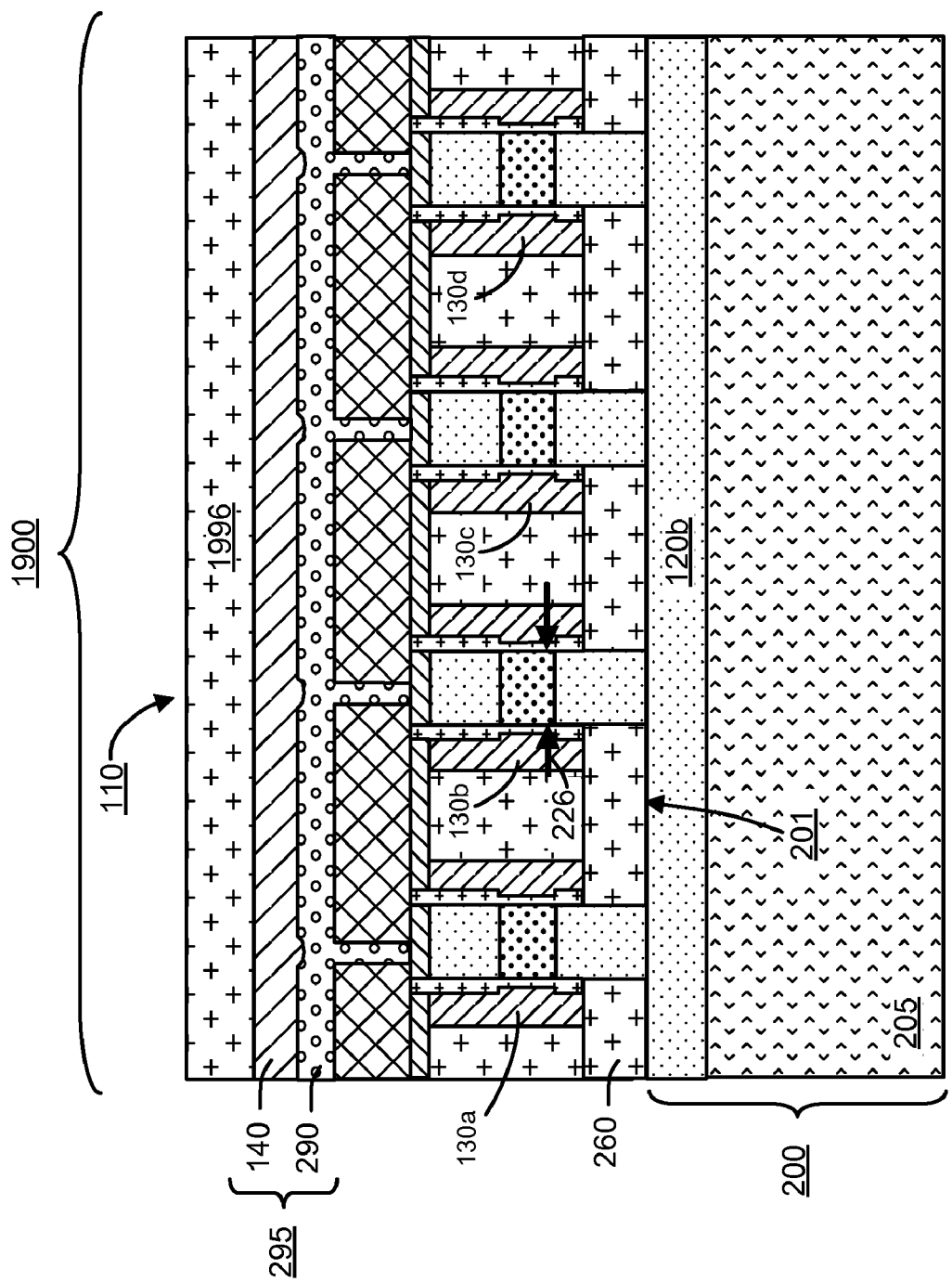
Figure 4:
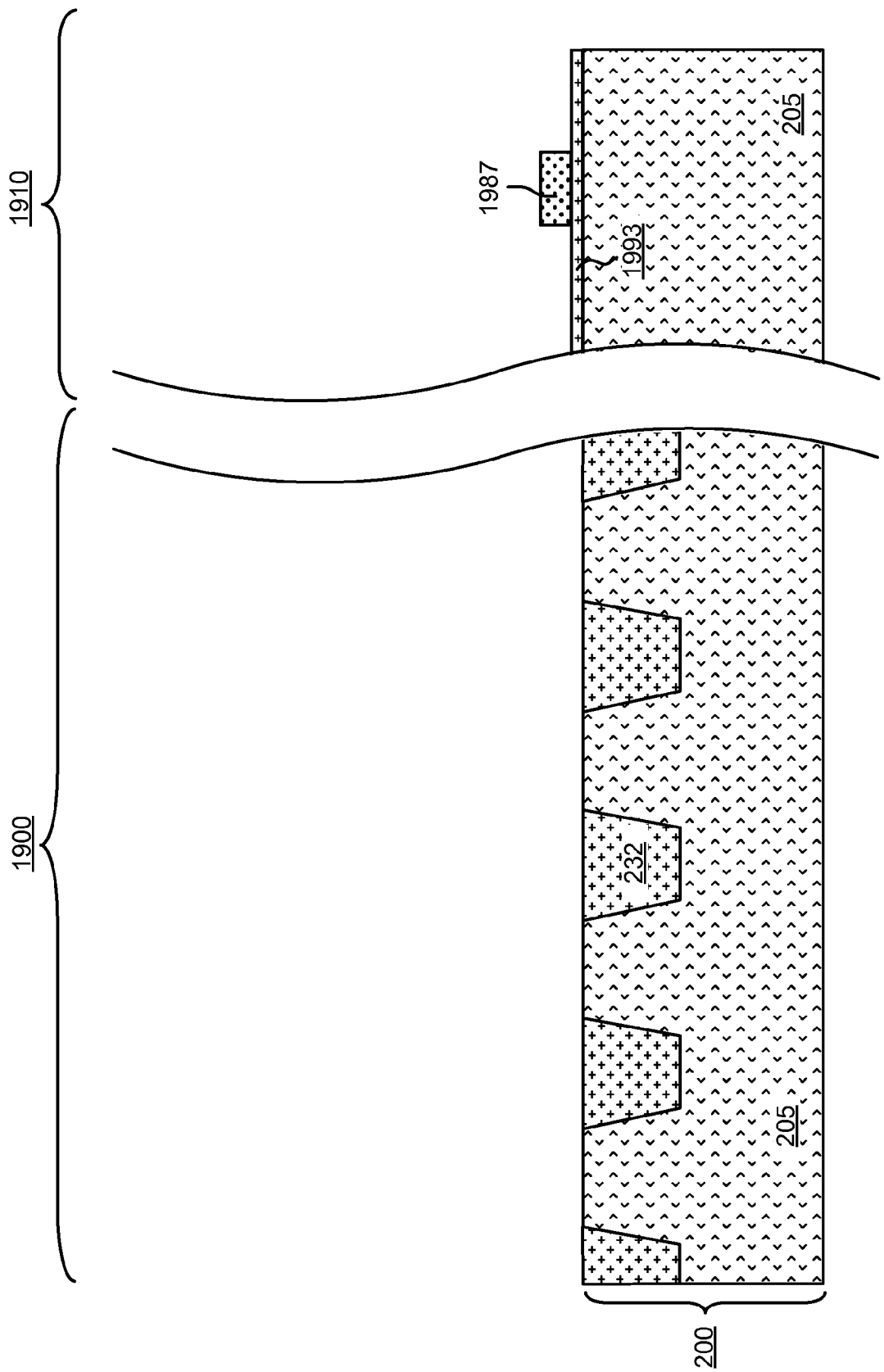

FIGS. 2C and 2D illustrate cross-sectional views an alternative embodiment in which the electrodes 250 of the array of FIGS. 2A and 2B are omitted and the memory material 290 of the memory element 125 extends within the opening in the dielectric 270 to contact the conductive cap 127, resulting in a pore-type cell.

In the cross-sectional views of FIGS. 2A-2B the programmable resistance memory material 290 is a blanket layer of programmable resistance memory material extending across to contacting the electrodes 250 of the memory cells of the array 100, and thus the array 100 is not subject to the etching damage problems discussed above. In FIGS. 2A-2B the conductive material 140 comprises a blanket layer of conductive material on the blanket layer of programmable resistance memory material. In some embodiments the memory material 290 and the conductive material 140 may be patterned, for example, to form patches, strips or grids, the formation of patches, strips or grids removing memory material that is spaced away from the active regions so that the active regions are not subject to etch damage.

The channel regions 123 have a top view cross-sectional channel area which in the illustrated embodiment is defined by a first dimension 224 along a first direction along the word lines 130 as shown in FIG. 2A, and a second dimension 226 along a second direction along the bit lines 120 perpendicular to the first direction as shown in FIG. 2B. In some embodiments the memory material 290 may be patterned into a plurality of memory patches each having a top view cross-sectional patch area. This patch area may be, for example, greater than or equal to ten times the top view cross-sectional area of the channel regions 123 so that the memory patches are shared among neighboring memory cells and the active regions are not subject to etch damage.

In yet other embodiments the conductive material 140 may be patterned, for example into strips or a grid structure, while maintaining a blanket layer of memory material for the memory plane 290.

As can be seen in FIG. 2A, because of the vertical channel structure of the field effect transistors the memory cell density along the word lines 130b is determined by the width of the bit lines 120 and the separation distance between adjacent bit lines 120. As can be seen in FIG. 2B, the memory cell density along the bit lines 120b is determined by the width of the word lines 130 and the separation distance between adjacent word lines 130. Thus, the cross-sectional area of the memory cells of the array 100 is determined entirely by dimensions of the word lines 130 and bit lines 120, allowing for a high memory density of the array.

Additionally, since the channel region 123 and the first and second terminals 122, 126 are arranged vertically the field effect transistor can have a small cross-sectional area while also providing sufficient current to induce phase change. The length of the channel of the device is determined by the height of the channel region 123 and can made small, while the width of the channel of the device is dependent upon the circumference of the channel region 123 and can be made relatively large compared to the length. Thus, a relatively large width-to-length ratio can be achieved such that higher reset current can be obtained.

Embodiments of the programmable resistance material 290 of the memory plane include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997)). More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

FIGS. 3 to 11 illustrate steps in a fabrication sequence suitable for manufacturing an array of memory cells illustrated in FIGS. 2A-2B.

FIG. 3 illustrates a step including forming a substrate 200 comprising a well 205 and trench isolation structures 232 within the well 205 and extending into and out of the cross-section illustrated in FIG. 20. The well 205 can be formed by implantation and activation annealing processes as known in the art. In the illustrated embodiment the well comprises doped P type material of silicon substrate 200. The substrate 200 has top surface 201.

Next, gate dielectric layer 1993 is formed on the top surface 201 of the periphery region 1910 of the substrate 200 of FIG. 3. Gate structure 1987 is formed by depositing and patterning doped polysilicon material, and then forming a conductive cap comprising silicide on the doped polysilicon material, resulting in the structure illustrated in the cross-sectional view of FIG. 4. Alternatively, other techniques may be used to form the gate structure 1987.

Figure 5:
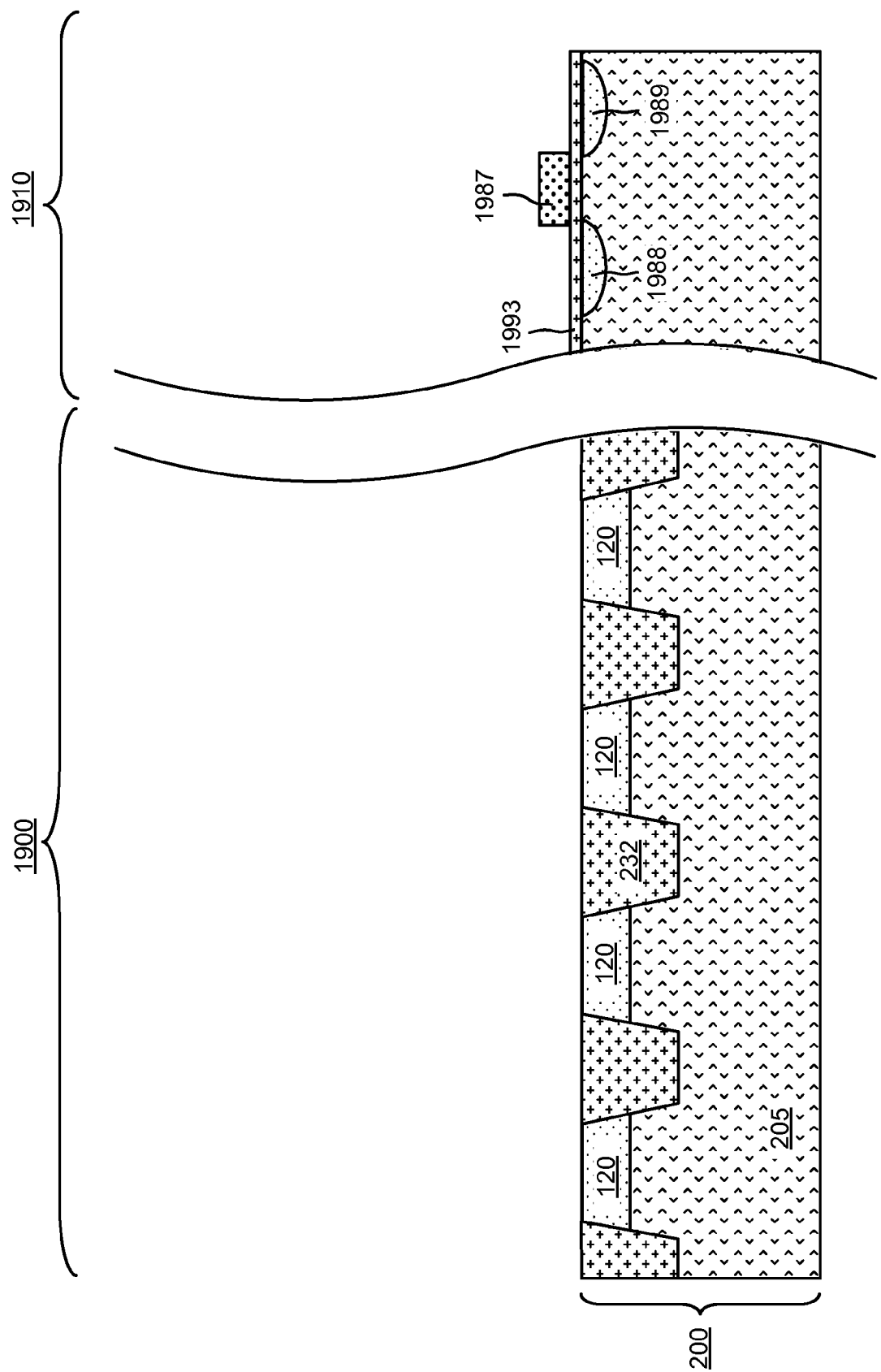

Next, the bit lines 120 are formed within the well 205 and doped regions 1988, 1989 acting as the source and drain are formed within the periphery region 1910, resulting in the structure illustrated in the cross-sectional view of FIG. 5. In the illustrated embodiment the bit lines 120 and doped regions 1988, 1989 are formed by ion implantation.

Figure 6:
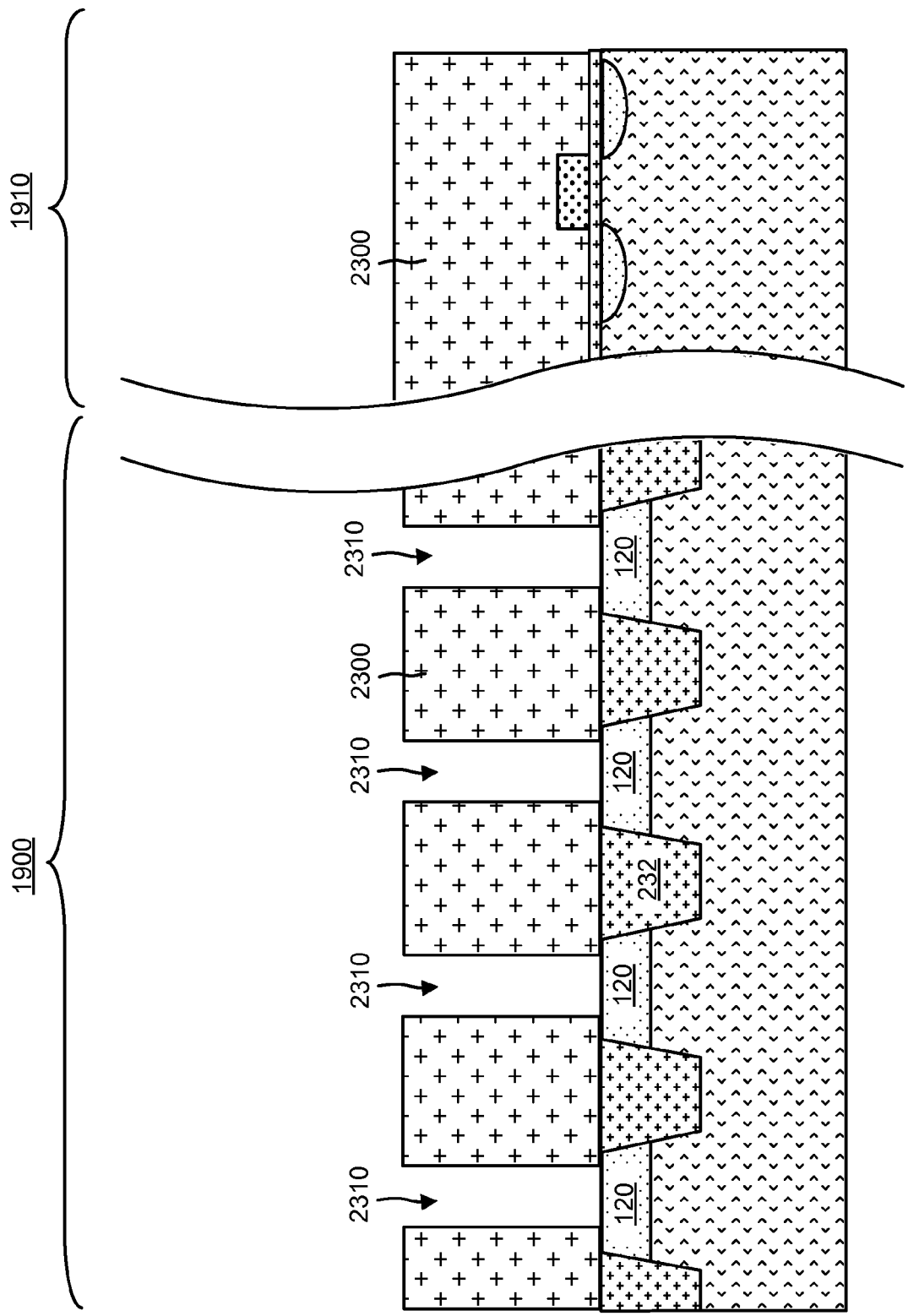

Next, dielectric 2300 is formed on the structure illustrated in FIG. 5 and a plurality of openings 2310 are formed in the dielectric 2300 to expose portions of the bit lines 120, resulting in the structure illustrated in FIG. 6. The dielectric 2300 may comprise, for example, boro-phospho-silicate glass (BPSG) or PSG.

Figure 7:
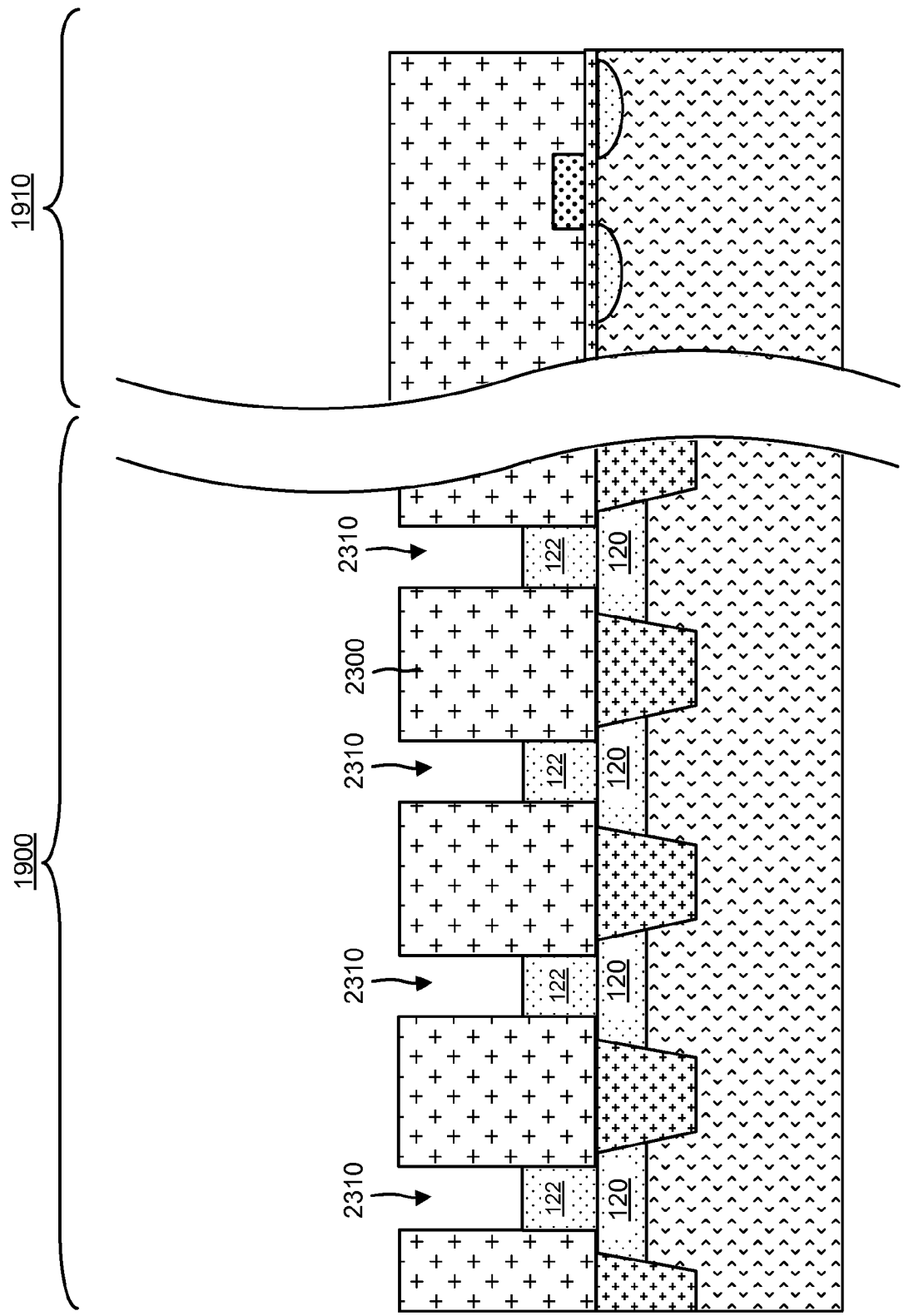

Next, a selective epitaxial process is performed within the openings 2310 to form doped regions (first terminals) 122 on the bit lines 120, resulting in the structure illustrated in the cross-sectional view of FIG. 7. In the illustrated embodiment the doped regions 122 comprise N-type doped silicon.

Figure 8:
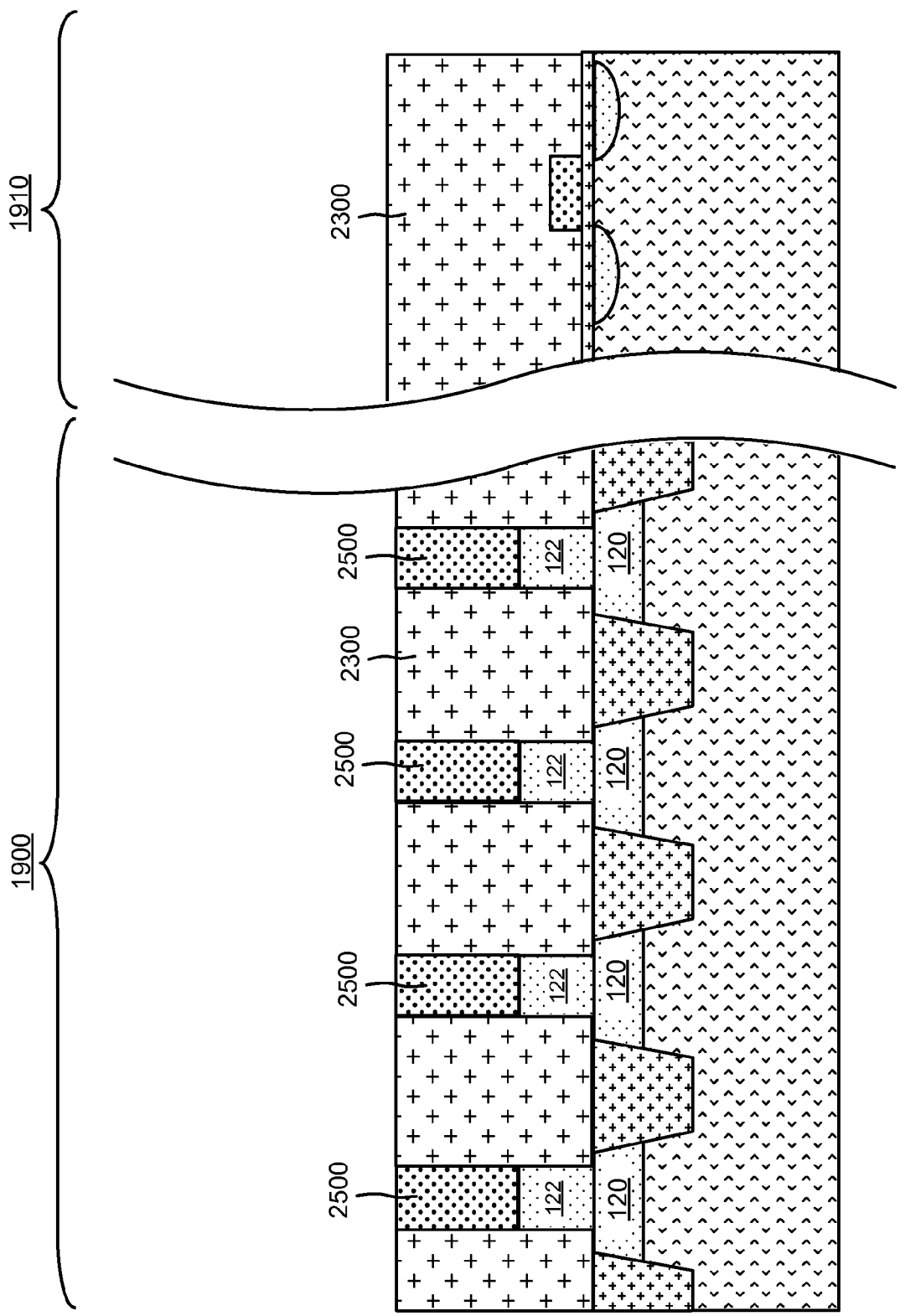

Next, another selective epitaxial process is performed within the openings and a planarizing process such as CMP is performed to form doped pillars 2500, resulting in the structure illustrated in the cross-sectional view of FIG. 8. The doped pillars 2500 have a conductivity type opposite that of the doped regions 122, and in the illustrated embodiment comprise P-type doped silicon.

Figure 9:
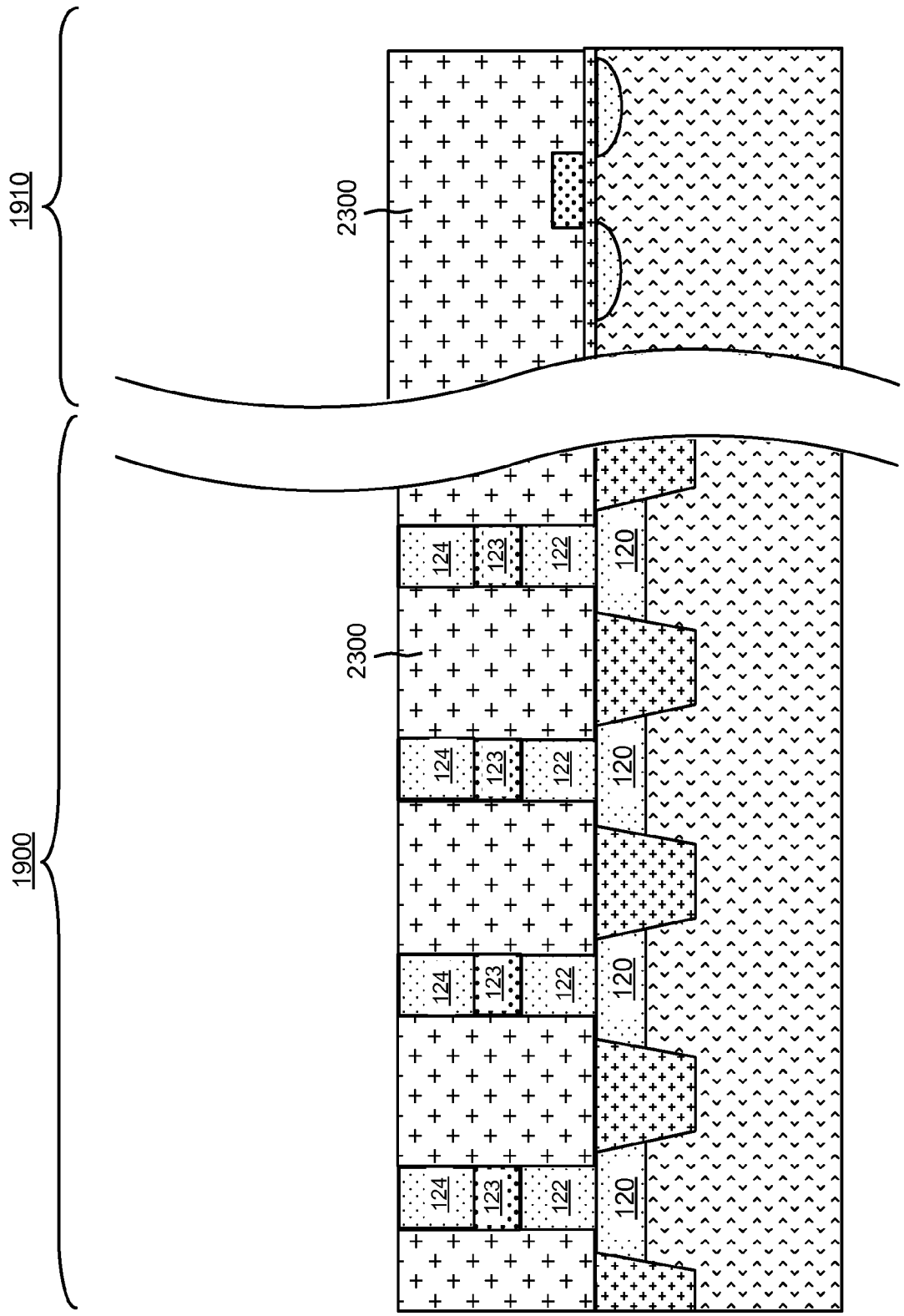

Next, an implantation process is performed to implant dopants within an upper portion of the pillars 2500 to form doped regions (second terminals) 124 having the same conductivity type as the doped regions 122, resulting in the structure illustrated in the cross-sectional view of FIG. 9. The remaining portions of the pillars 2500 between the doped regions 122 and 124 are the channel regions 123 of the access transistors.

Alternatively, the doped regions 122, 124 and channel regions 123 may be formed using a single selective epitaxial process, rather the two selective epitaxial processes used in the illustrated embodiment of FIGS. 7-9. For example, in one such alternative embodiment a selective epitaxial process is performed within the openings 2310 of the structure of FIG. 6 to form doped pillars filling the openings 2310, the doped pillars and having a first conductivity type. Next, dopants are implanted within the doped pillars to form the channel regions having a second conductivity type opposite the first conductivity type, and form the second terminals on the channel regions and having the first conductivity type. The portions of the doped pillars underlying the channel regions are the first terminals.

Figure 10:
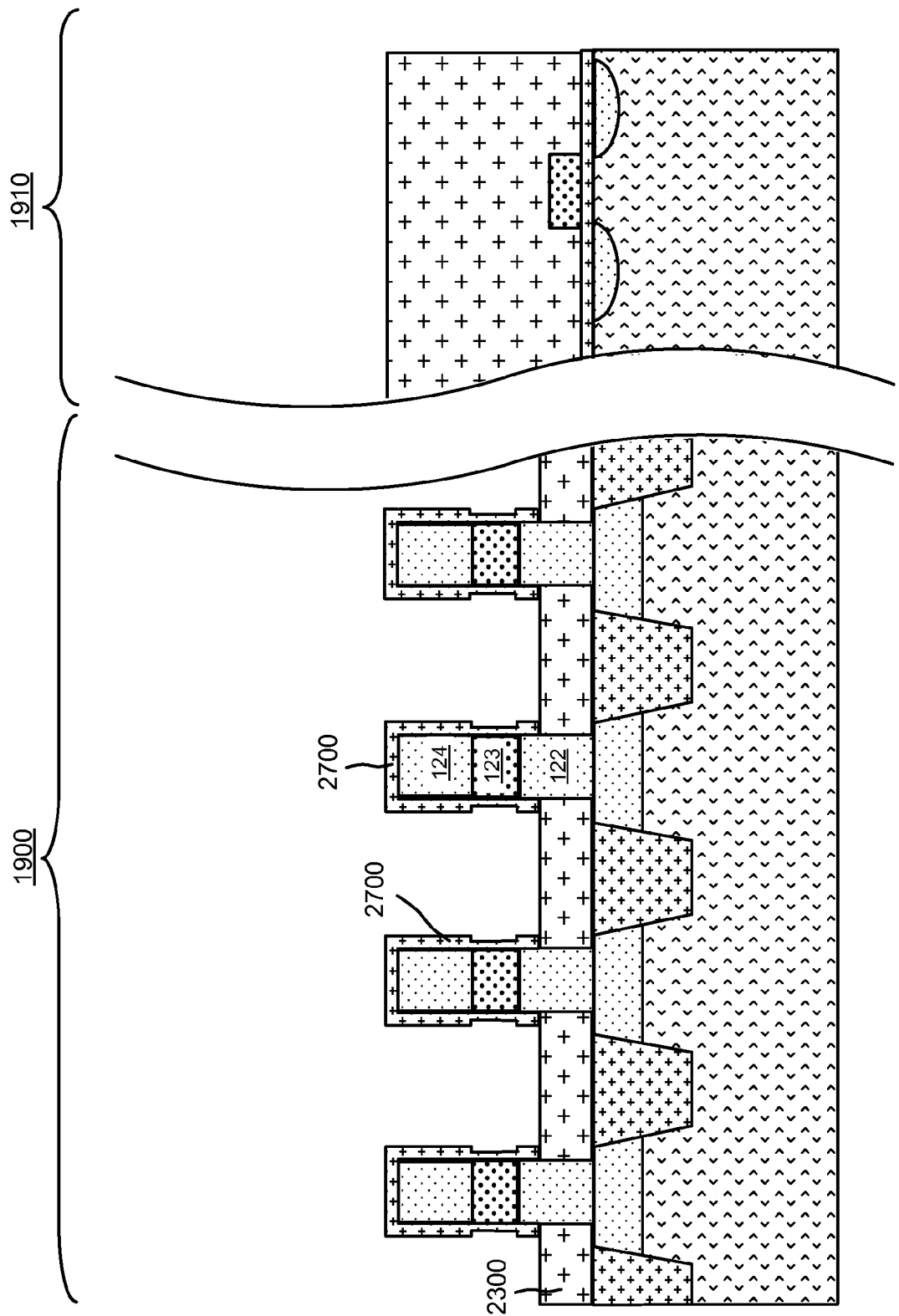

Referring back to the structure illustrated in FIG. 9, next a portion of dielectric 2300 is removed to expose outer surfaces of the doped regions 122, 123, 124 and dielectric 2700 is grown on the exposed outer surfaces, resulting in the structure illustrated in the cross-sectional view of FIG. 10.

Word line material, for example polysilicon, is then deposited on the structure illustrated in FIG. 10, and planarized to expose a top surface of doped regions 124. The word line material is then patterned and a silicide process is performed to form conductive caps 127 on the doped regions 124 and conductive layers on the tops of the word lines, resulting in the structure illustrated in the cross-sectional and top views of FIGS. 11A and 11B. The conductive cap 127 and conductive layers on the tops of the word lines comprise a silicide containing, for example, Ti, W, Co, Ni, or Ta. In one embodiment they comprise cobalt silicide (CoSi) and are formed by depositing cobalt and performing a rapid thermal process (RTP) such that the cobalt reacts with the silicon of the doped regions 124 to form the conductive caps 127 and reacts with the word line material to form the conductive layers. It is understood that other silicides may also be formed in this manner by depositing titanium, arsenic, doped nickel, or alloys thereof, in a manner similar to the example described herein using cobalt.

Figure 11A:
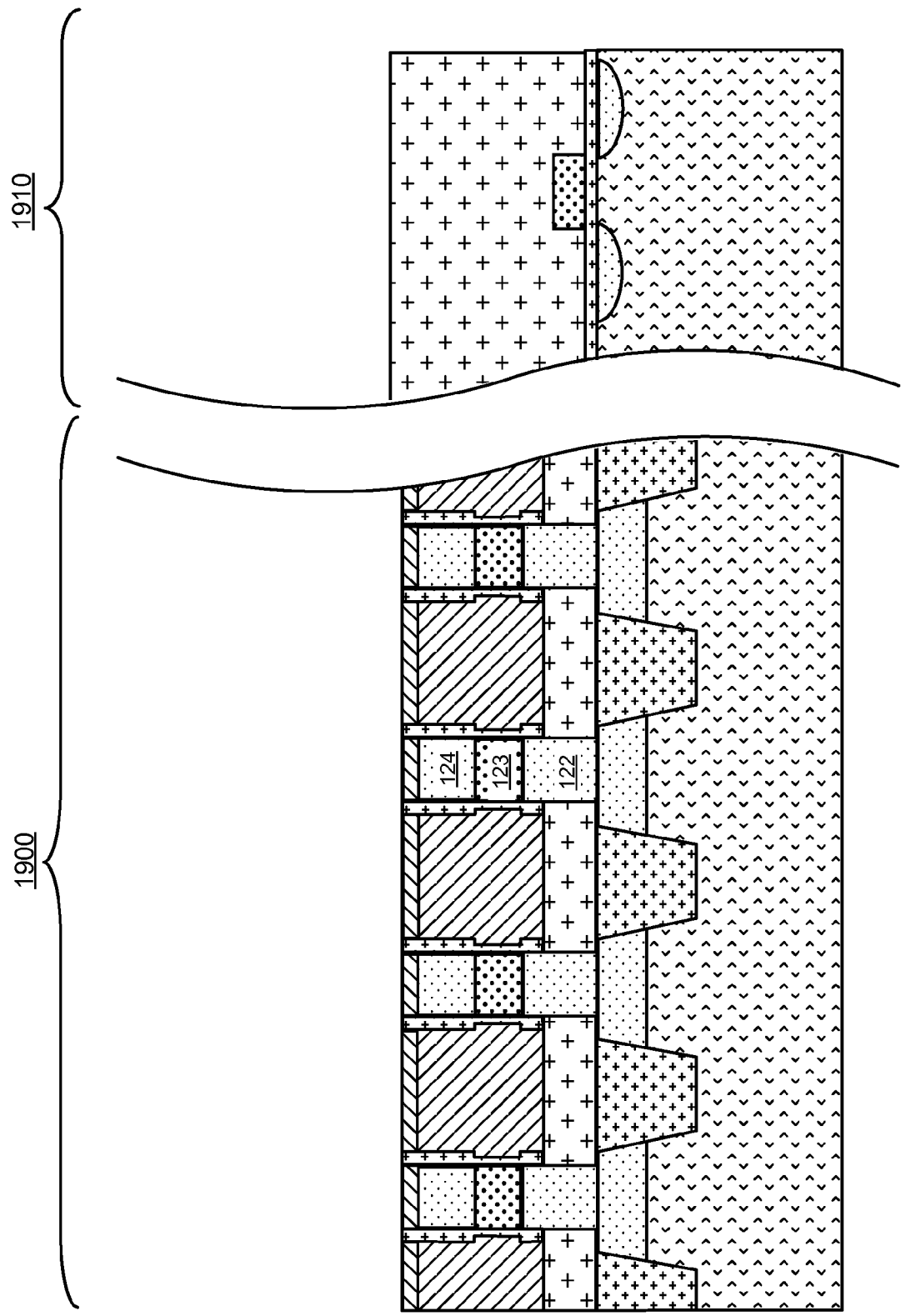
Figure 11B:
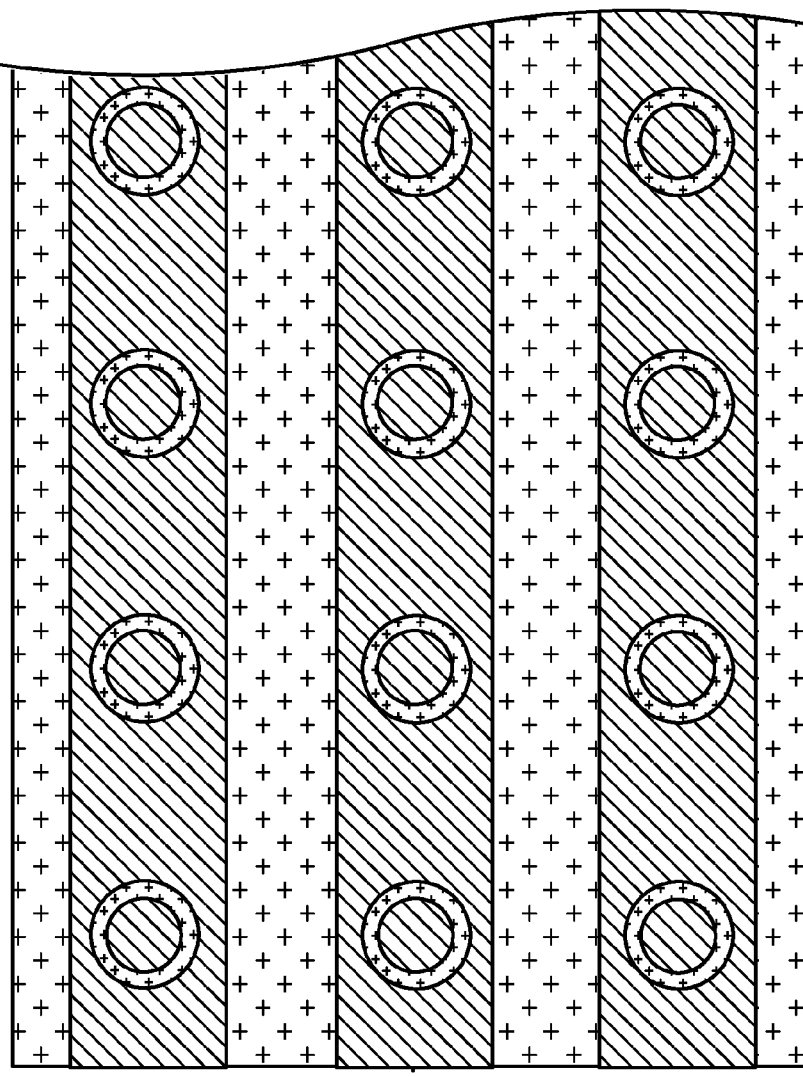

Next, a dielectric layer 270 is formed on the structure illustrated in FIGS. 11A-11B and openings having respective widths are formed through the dielectric layer to expose of a portion of the conductive caps 127.

The openings having a sublithographic widths can be formed, for example, by forming an isolation layer on the dielectric 270 and forming a sacrificial layer on the isolation layer. Next, a mask having openings close to or equal to the minimum feature size of the process used to create the mask is formed on the sacrificial layer, the openings overlying the locations of the openings 1000. The isolation layer and the sacrificial layer are then selectively etched using the mask, thereby forming vias in the isolation and sacrificial layers and exposing a top surface of the dielectric 270. After removal of the mask, a selective undercutting etch is performed on the vias such that the isolation layer is etched while leaving the sacrificial layer and the dielectric 270 intact. A fill material is then formed in the vias, which due to the selective undercutting etch process results in a self-aligned void in the fill material being formed within each via. Next, an anisotropic etching process is performed on the fill material to open the voids, and etching continues until the dielectric 270 is exposed in the region below the vias, thereby forming a sidewall spacer comprising fill material within each via. The sidewall spacers have an opening dimension substantially determined by the dimensions of the voids, and thus can be less than the minimum feature size of a lithographic process. Next, the dielectric 270 is etched using the sidewall spacers as an etch mask, thereby forming openings having a widths less than the minimum lithographic feature size. The isolation layer and the sacrificial layer can be removed by a planarization process such as CMP. See, for example, U.S. Pat. No. 7,351,648 and U.S. patent application Ser. No. 11/855,979, which are incorporated by reference herein.

Next, electrodes 250 are formed within the openings in the dielectric layer 270 to contact the conductive caps 127. The electrodes 250 can be formed, for example, by depositing electrode material within the openings in the dielectric layer 270 using Chemical Vapor Deposition, followed by a planarizing process such as CMP. In embodiments in which the openings are formed using an isolation layer and a sacrificial layer as described above, in alternative embodiments the electrode material may be deposited within the openings and overlying the isolation layer and the sacrificial layer. A subsequent planarization process such as CMP can then remove the isolation layer and the sacrificial layer.

Next, memory material 290 can be formed by blanket depositing a layer of memory material, and the conductive material 140 can be formed by blanket depositing one or more layers of conductive material 140 overlying the memory material 290. Dielectric 1996 is then formed, contacts 1950, 1995, 1965 are formed, and conductive lines 1997 and 1960 are formed, resulting in the structure illustrated in the cross-sectional views of FIGS. 2A-2B.

In an alternative embodiment, the step of forming the electrodes 250 within the openings in the dielectric layer 270 discussed above is omitted. Instead, memory material 290 is formed on the structure and within the openings in the dielectric layer 270, and conductive material 140 is formed on the memory material 290, resulting in the structure illustrated in FIGS. 2C-2D.

Since the logic devices in the periphery region and the memory cells having vertical channel access transistors in the memory region are manufactured concurrently in the manufacturing steps described, the memory device has a reduced complexity and addresses design integration issues of periphery and memory regions.

Figure 12:
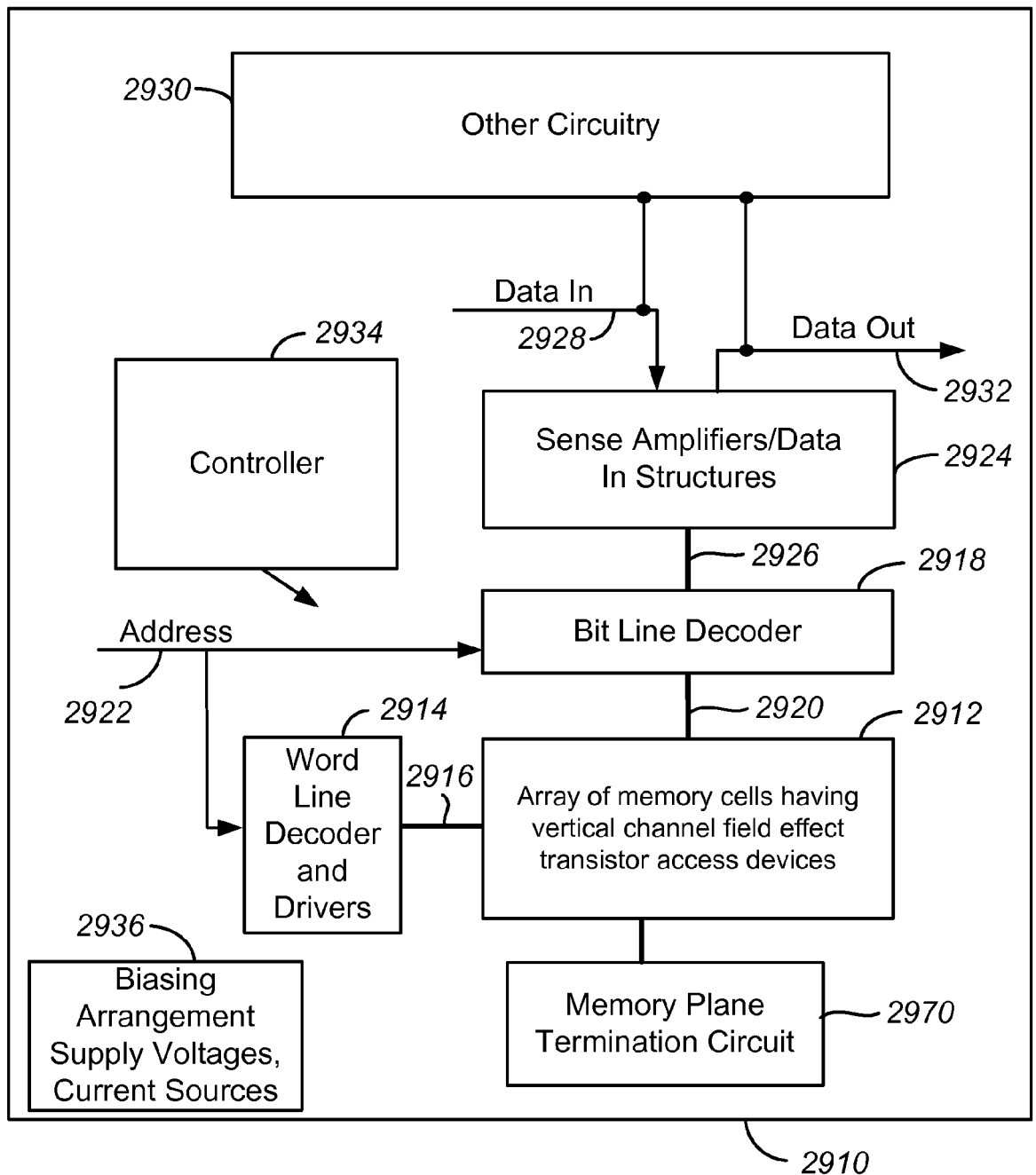
FIG. 12 is a simplified block diagram of an integrated circuit including a memory array implemented using memory cells having a memory plane overlying vertical channel field effect transistor access devices.

FIG. 12 is a simplified block diagram of an integrated circuit 2910 including a memory array 2912 implemented using memory cells having a memory plane overlying vertical channel field effect transistor access devices as described herein. A memory plane termination circuit 2970 is coupled to the array and provides a common voltage to the memory plane of the array 2912. A word line decoder 2914 having read, set and reset modes is coupled to and in electrical communication with a plurality of word lines 2916 arranged along rows in the memory array 2912. A bit line (column) decoder 2918 is in electrical communication with a plurality of bit lines 2920 arranged along columns in the array 2912 for reading, setting, and resetting the phase change memory cells (not shown) in array 2912. Addresses are supplied on bus 2922 to word line decoder and drivers 2914 and bit line decoder 2918. Sense amplifiers and data-in structures in block 2924, including voltage and/or current sources for the read, set, and reset modes are coupled to bit line decoder 2918 via data bus 2926. Data is supplied via a data-in line 2928 from input/output ports on integrated circuit 2910, or from other data sources internal or external to integrated circuit 2910, to data-in structures in block 2924. Other circuitry 2930 may be included on integrated circuit 2910, such as a general purpose processor or special purpose application circuitry, or a combination of modules providing system-on-a-chip functionality supported by array 2912. Data is supplied via a data-out line 2932 from the sense amplifiers in block 2924 to input/output ports on integrated circuit 2910, or to other data destinations internal or external to integrated circuit 2910.

A controller 2934 implemented in this example, using a bias arrangement state machine, controls the application of bias arrangement supply voltages and current sources 2936, such as read, program, erase, erase verify and program verify voltages and/or currents. Controller 2934 may be implemented using special-purpose logic circuitry as known in the art. In alternative embodiments, controller 2934 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 2934.

Figure 13:
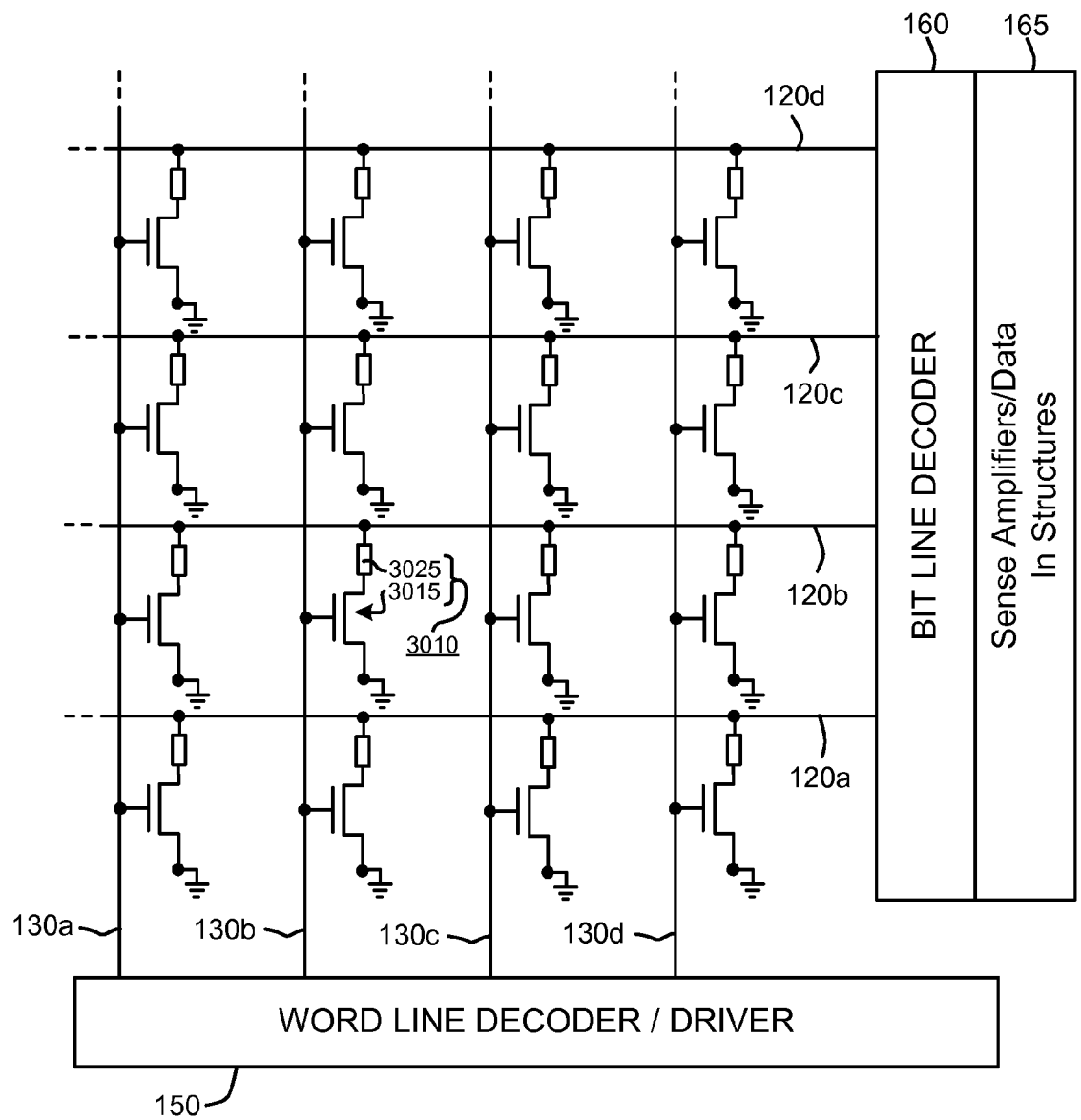
FIG. 13 illustrates a schematic diagram of a portion of a memory cell array implemented using memory cells having field effect transistors with vertical channels and memory elements comprising programmable resistance material, the transistors arranged in a common source configuration.

FIG. 13 illustrates a schematic diagram of a portion of a memory cell array 3000 implemented using memory cells having field effect transistors with vertical channels and memory elements comprising programmable resistance material, the transistors arranged in a common source configuration.

In a common source configuration, the source terminals of the memory cells are coupled to a common voltage, and the input and output are the gate and drain terminals respectively. Thus, in operation voltages and the bit lines 120 and word lines 130 induce a current from the bit lines 120 to the source terminals, or vice versa, through the drain terminals, channel regions, and memory elements.

In FIG. 13 the source terminals are coupled to ground. Alternatively, the source terminals may be coupled to a voltage source for applying a common voltage other than ground.

Memory cell 3010 is representative of memory cells of array 3000 and comprises field effect transistor 3015 and phase change memory element 3025. The word line 130*b* acts as the gate terminal of the transistor 3015, and the second terminal acting as the drain of the access transistor 3015 is coupled to the bit line 120*b* via the memory element 3025.

Reading or writing to memory cells of the array 3000 can be achieved by applying an appropriate voltage to the corresponding word line 130 and an appropriate voltage or current to the corresponding bit line 120 to induce a current through the memory element. The level and duration of the voltages/currents applied is dependent upon the operation performed, e.g. a reading operation or a writing operation.

Figure 14A:
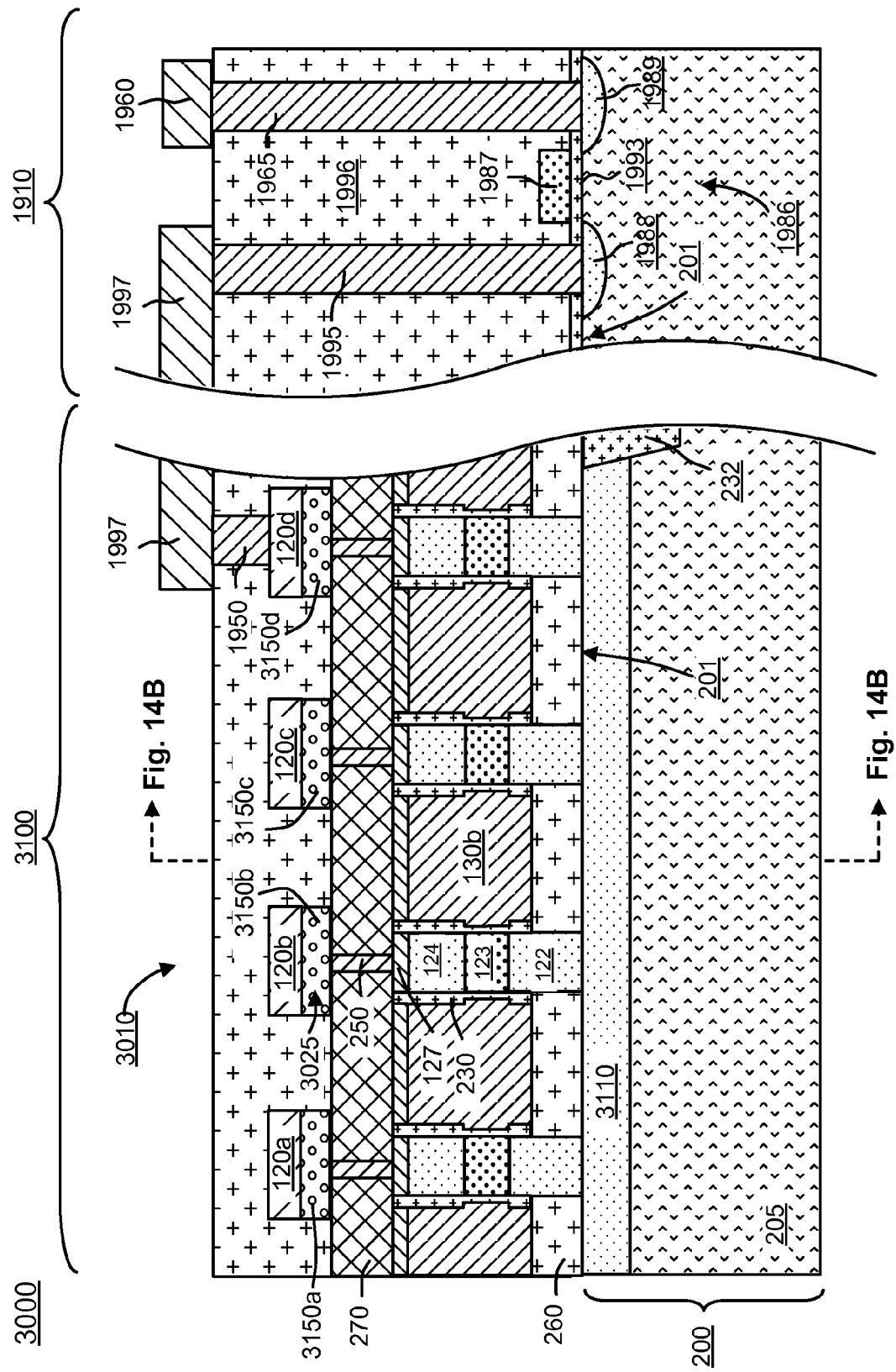
FIGS. 14A-14B illustrate cross-sectional views of a portion of an embodiment of memory cells arranged in the array of FIG. 13.
Figure 14B:
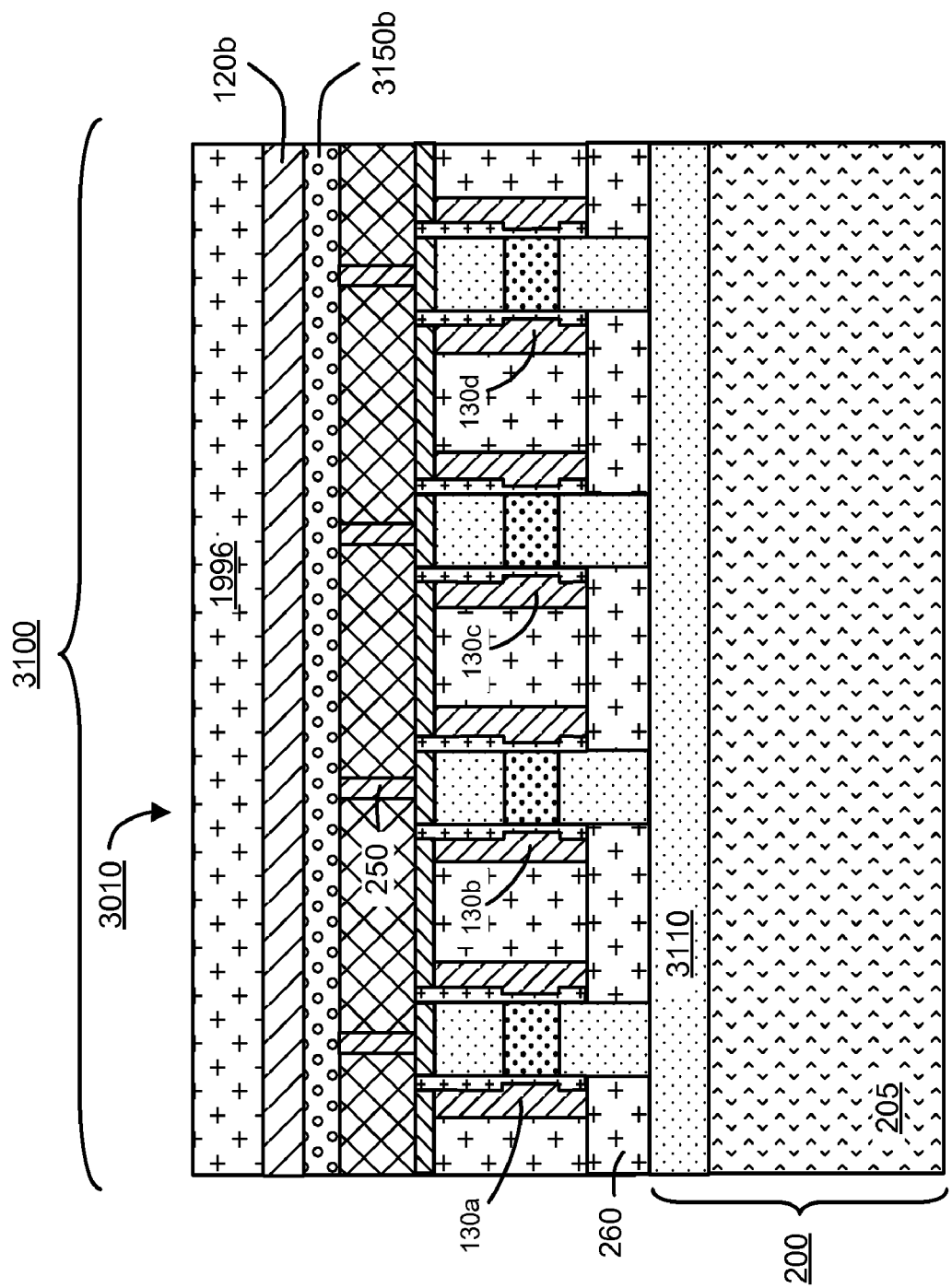

FIGS. 14A and 14B illustrate cross-sectional views of a portion of an embodiment of memory cells (including representative memory cell 3110) arranged in the array 3000, FIG. 14A taken along the word lines 130 and FIG. 14B taken along the bit lines 120.

In FIGS. 14A-14B the array 3000 includes memory region 3100 and periphery region 1910 on the single-crystalline semiconductor substrate 200.

The memory region 3100 includes common doped region 3110 underlying the first terminals 122 of the access transistors of the array 300 to coupled the transistors in a common source configuration. The common doped region 3100 has a conductivity type opposite that of the well 205, and in the illustrated embodiment comprises N-type doped material. The common doped region 3110 is coupled to a common voltage, for example by an array of contacts (not shown).

As can be seen in FIGS. 14A and 14B, the programmable resistance memory material on the electrodes 250 comprises strips 3150 of memory material. The bit lines 120 comprise conductive material on the strips 3150 of memory material. The memory elements of the array 3000 comprises a portion of a strip 3150 adjacent the corresponding electrodes 250. For example, memory element 3025 of memory cell 3010 comprises a portion of the strip 3150b.

As can be seen in FIGS. 14A and 14B, the first terminals 122 of the access transistors in the memory region 3100 and the gate dielectric layer 1993 are both on the substantially planar top surface 201 of the substrate. As described in more detail below with reference to FIGS. 15 to 16, the logic device 1986 in the periphery region and the memory cells having vertical channels can be manufactured concurrently. As a result, the memory device has a reduced complexity and addresses design integration issues of periphery and memory regions, thereby reducing the cost.

In FIGS. 14A-14B the memory cells are implemented in a mushroom-type configuration. Alternatively, other types of configurations can be used. In one alternative embodiment the electrodes 250 of the array of FIGS. 14A-14B are omitted and the memory material of the strips 3150 extend within the opening in the dielectric 270 to contact the conductive cap 127, resulting in a pore-type configuration like that shown in FIGS. 2C-2D.

Figure 15:
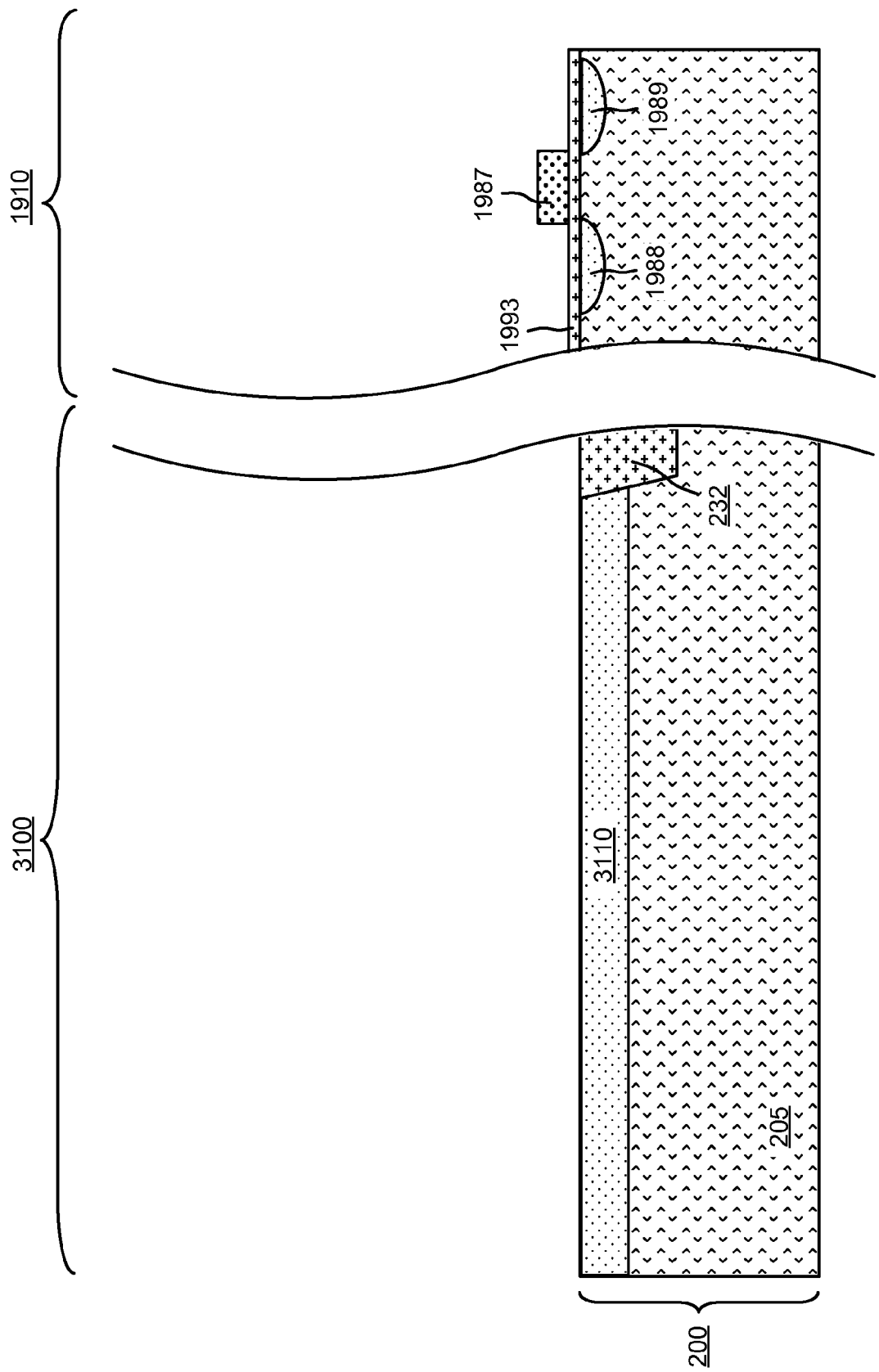
FIGS. 15-16B illustrate steps in a fabrication sequence for manufacturing the array of memory cells of FIGS. 14A-14B.

FIGS. 15 to 16 illustrate steps in a fabrication sequence suitable for manufacturing an array of memory cells illustrated in FIGS. 14A-14B.

Trench isolation structures 232 are formed in the well 205, gate dielectric layer 1993 is formed on the top surface 201 of the periphery region 1910 of the substrate 200, and gate structure 1987 is formed on the gate dielectric layer 1993. The well 205, trench isolation structure 232, gate dielectric layer 1987, and gate structure 1987 can be formed, for example, as described above with reference to FIGS. 3-4. Next, common doped region 3110 and doped regions 1988, 1989 are formed within the periphery region 1910, resulting in the structure illustrated in the cross-sectional view of FIG. 15. In the illustrated embodiment the common doped region 3110 and doped regions 1988, 1989 are formed by a single ion implantation process, and thus are formed at the same time.

Next, the word lines 130, the first and second terminals 122, 124 and channel regions 123 can be formed as discussed above with reference to FIGS. 6 to 11. Next, dielectric material 270 and electrodes 250 are formed, for example, as discussed above with reference to FIGS. 11A-11B.

Figure 16A:
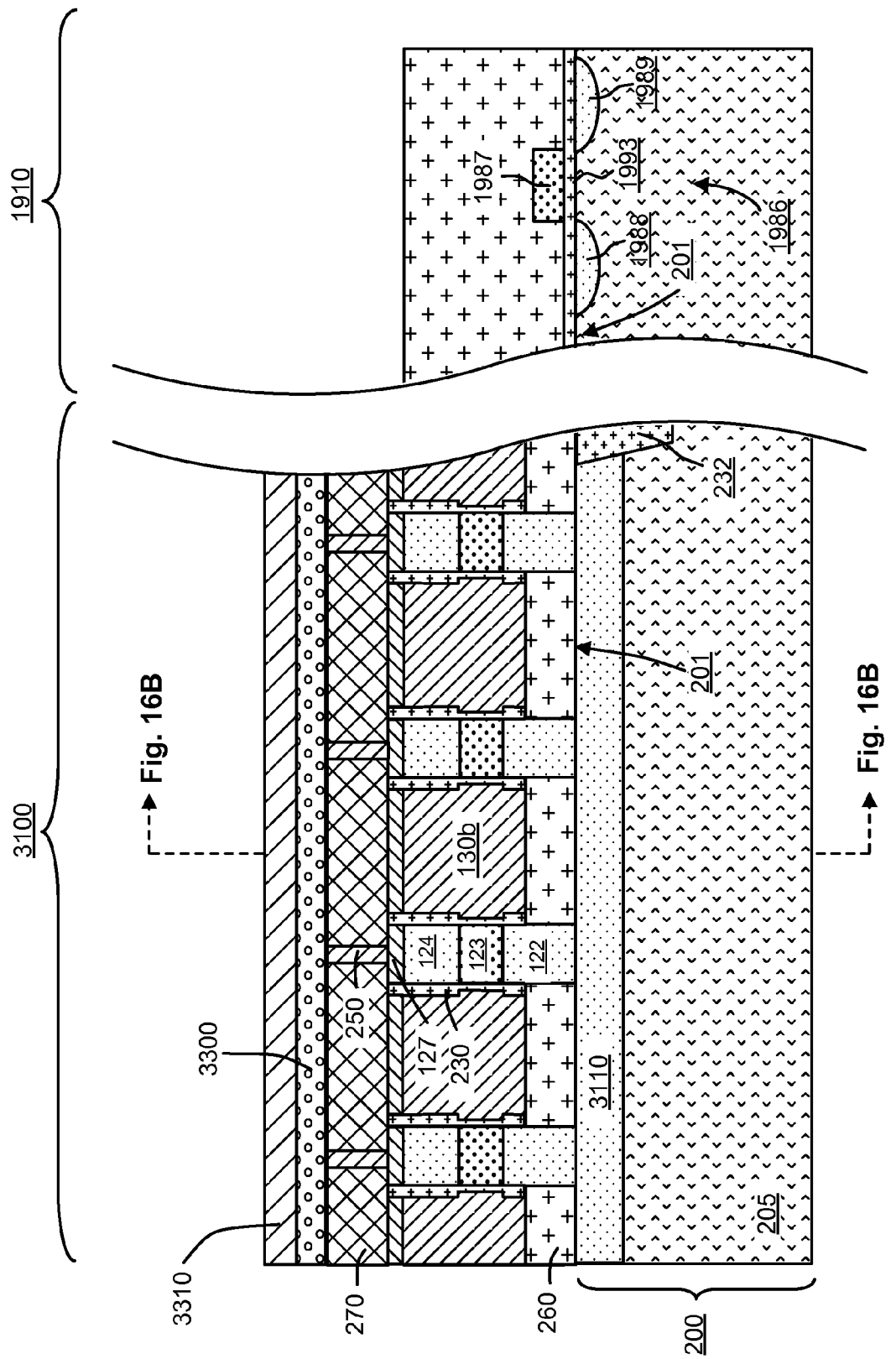
Figure 16B:
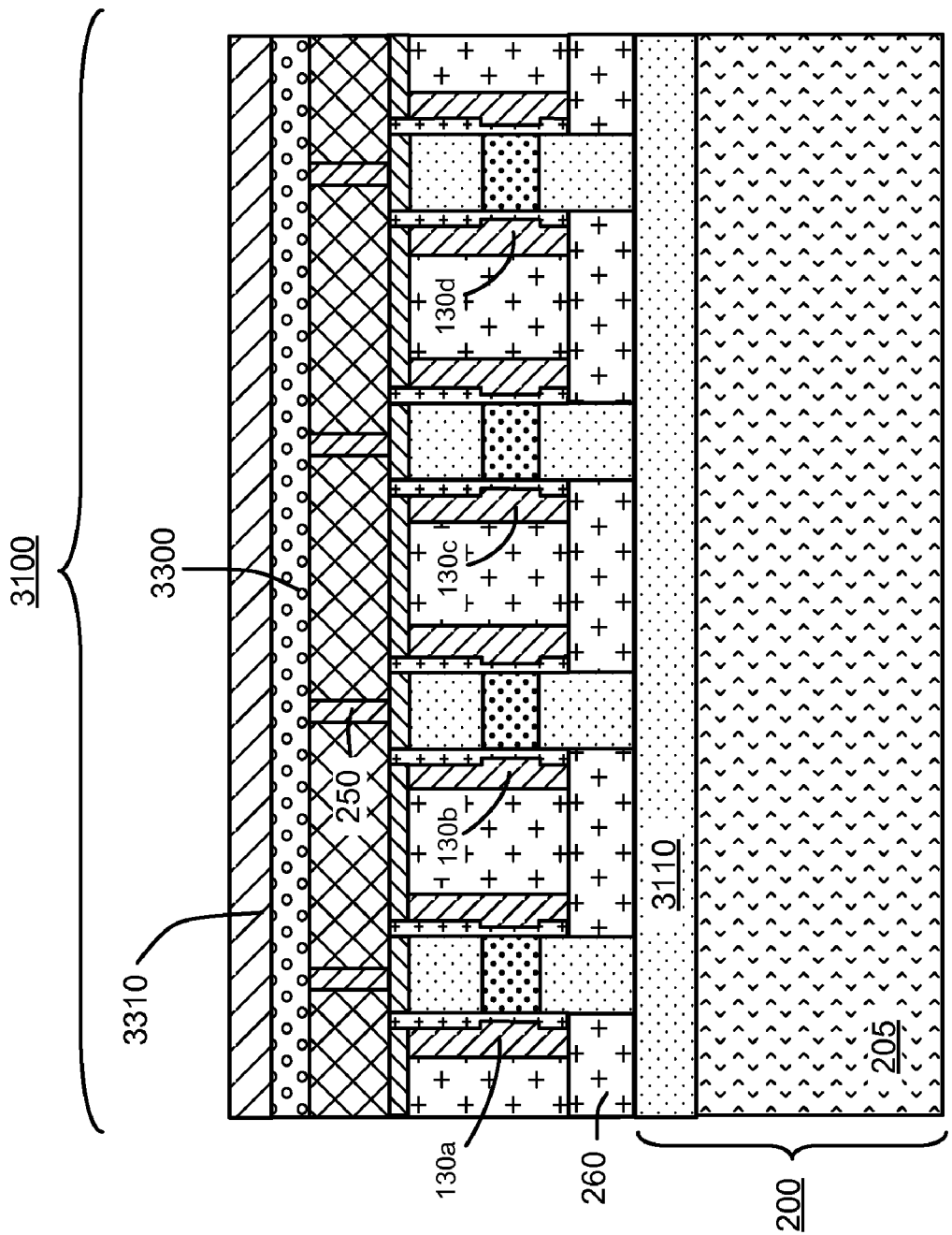

Next, memory material layer 3300 is formed on the electrodes 250, and conductive bit line material 3310 is formed on the memory material layer 3300, resulting in the structure illustrated in the cross-sectional views of FIGS. 16A-16B. The memory material layer 3300 and conductive bit line material 3310 are then patterned to form strips 3150 of memory material and bit lines 120 on the strips. The strips 3150 and bit lines 120 can be formed by forming a lithographic mask on the conductive bit line material 3310 and then etching the memory material layer 3300 and conductive bit line material 3310. Dielectric 1996 is then formed, contacts 1950, 1995, 1996 are formed, and conductive lines 1997 and 1960 are formed, resulting in the structure illustrated in the cross-sectional views of FIGS. 14A-14B.

Figure 17:
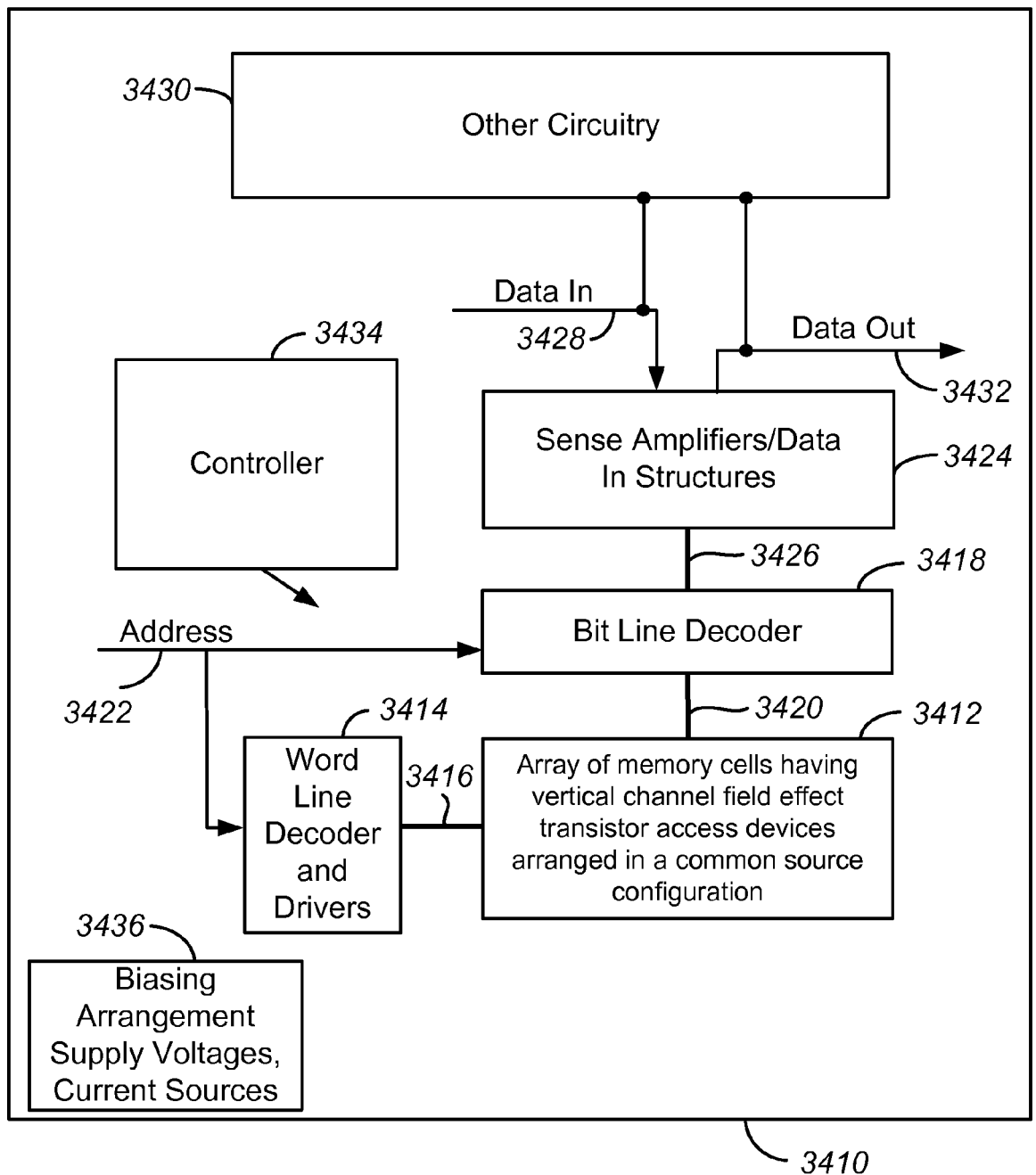
FIG. 17 is a simplified block diagram of an integrated circuit including a memory array implemented using memory cells vertical channel field effect transistor access devices arranged in a common source configuration.

FIG. 17 is a simplified block diagram of an integrated circuit 3410 including a memory array 3412 implemented using memory cells having vertical channel field effect transistor access devices arranged in a common source configuration as described herein. A word line decoder 3414 having read, set and reset modes is coupled to and in electrical communication with a plurality of word lines 3416 arranged along rows in the memory array 3412. A bit line (column) decoder 3418 is in electrical communication with a plurality of bit lines 3420 arranged along columns in the array 3412 for reading, setting, and resetting the phase change memory cells (not shown) in array 3412. Addresses are supplied on bus 3422 to word line decoder and drivers 3414 and bit line decoder 3418. Sense amplifiers and data-in structures in block 3424, including voltage and/or current sources for the read, set, and reset modes are coupled to bit line decoder 3418 via data bus 3426. Data is supplied via a data-in line 3428 from input/output ports on integrated circuit 3410, or from other data sources internal or external to integrated circuit 3410, to data-in structures in block 3424. Other circuitry 3430 may be included on integrated circuit 3410, such as a general purpose processor or special purpose application circuitry, or a combination of modules providing system-on-a-chip functionality supported by array 3412. Data is supplied via a data-out line 3432 from the sense amplifiers in block 3424 to input/output ports on integrated circuit 3410, or to other data destinations internal or external to integrated circuit 3410.

A controller 3434 implemented in this example, using a bias arrangement state machine, controls the application of bias arrangement supply voltages and current sources 3436, such as read, program, erase, erase verify and program verify voltages and/or currents. Controller 3434 may be implemented using special-purpose logic circuitry as known in the art. In alternative embodiments, controller 3434 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 3434.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. A device comprising:
 a substrate having a first region and a second region;
 the first region comprising:
  a first field effect transistor comprising first and second doped regions separated by a horizontal channel region within the substrate, a gate of the first field effect transistor overlying the horizontal channel region, and a first dielectric covering the gate of the first field effect transistor;
 the second region comprising:
 a second field effect transistor comprising:
  a first terminal extending through the first dielectric to contact the substrate;
  a second terminal overlying the first terminal and having a top surface;
  a vertical channel region separating the first and second terminals;
  a gate of the second field effect transistor on the first dielectric and adjacent the vertical channel region, the gate of the second field effect transistor having a top surface that is co-planar with the top surface of the second terminal; and
  a second dielectric separating the gate of the second field effect transistor from the vertical channel region.
2. The device of claim 1, wherein the first region is a periphery region and the second region is a memory region, and the second region further comprises a memory element electrically coupled to the second terminal of the second field effect transistor.

3. The device of claim 1, wherein the first region is a periphery region and the second region is a memory region, and the second region further comprises:
a plurality of word lines on the first dielectric;
an array comprising a plurality of field effect transistors including the second field effect transistor, the gate of the second field effect transistor coupled to a corresponding word line in the plurality of word lines; and
programmable resistance memory material electrically coupled to the second terminal of the second field effect transistor, and conductive material on the programmable resistance memory material.

4. The device of claim 3, wherein:
the conductive material on the programmable resistance memory material comprises a plurality of bit lines; and
the second region further comprises a common doped region within the substrate underlying first terminals of the transistors in the array to couple the array in a common source configuration.

5. The device of claim 4, wherein the programmable resistance memory material comprises a plurality of strips, strips in the plurality of strips underlying a corresponding bit line in the plurality of bit lines.

6. The device of claim 3, further comprising a plurality of bit lines within the substrate underlying the first terminal of the second field effect transistor, the first terminal of the second field effect transistor contacting a corresponding bit line in the plurality of bit lines.

7. The device of claim 6, wherein the programmable resistance memory material and the conductive material are a memory plane, the conductive material coupled to a common voltage.

8. The device of claim 7, wherein the memory plane comprises a blanket layer of the programmable resistance memory material overlying the second terminals of the transistors in the array.

9. The device of claim 7, wherein:
the channel region of the second field effect transistor has a top-view cross-sectional channel area; and
the memory plane comprises a plurality of memory patches of programmable resistance memory material, memory patches in the plurality of memory patches having a top-view cross-sectional patch area greater than or equal to ten times the top view cross-sectional channel area.

10. The device of claim 3, further comprising a plurality of vias within the word lines, a via in the plurality of vias having a sidewall surface surrounding the channel region and the second terminal of the second field effect transistor.

11. The device of claim 8, wherein the first and second terminals and channel region of the second field effect transistor form a stack extending through the corresponding via.

12. The device of claim 3, further comprising a plurality of electrodes, a corresponding electrode in the plurality of electrodes electrically coupled to the second terminals of the second field effect transistor.

13. The device of claim 12, further comprising a conductive cap comprising silicide on the second terminal of the second field effect transistor, the corresponding electrode extending through a third dielectric to contact a top surface of the conductive cap.

14. The device of claim 13, wherein the corresponding electrode has a top surface contacting the programmable resistance memory material, the top surface of the corresponding electrode having a surface area less than that of top surface of the conductive cap.

15. The device of claim 3, wherein programmable resistance memory material extends through openings in a third dielectric overlying the second terminal of the second field effect transistor.

* * * * *